United States Patent
Pan

(10) Patent No.: US 12,159,790 B2
(45) Date of Patent: Dec. 3, 2024

(54) METHOD FOR FABRICATING SEMICONDUCTOR DEVICE WITH DAMASCENE STRUCTURE BY USING ETCH STOP LAYER

(71) Applicant: NANYA TECHNOLOGY CORPORATION, New Taipei (TW)

(72) Inventor: Wei-Chen Pan, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 391 days.

(21) Appl. No.: 17/701,927

(22) Filed: Mar. 23, 2022

(65) Prior Publication Data

US 2023/0307248 A1    Sep. 28, 2023

(51) Int. Cl.
*H01L 21/311* (2006.01)
*H01L 21/033* (2006.01)
*H01L 21/308* (2006.01)
*H01L 21/768* (2006.01)

(52) U.S. Cl.
CPC .... *H01L 21/31144* (2013.01); *H01L 21/0337* (2013.01); *H01L 21/3086* (2013.01); *H01L 21/76816* (2013.01); *H01L 21/76832* (2013.01)

(58) Field of Classification Search
CPC .......... H01L 21/31144; H01L 21/0337; H01L 21/3086; H01L 21/76816; H01L 21/76832; H01L 2221/1021; H01L 2221/1036; H01L 21/0274; H01L 21/76807; H01L 21/76802; H01L 21/76877; G03F 1/50
See application file for complete search history.

(56) References Cited

U.S. PATENT DOCUMENTS

2003/0207180 A1* 11/2003 Shu ........................... G03F 1/50
                                                          430/5
2006/0014381 A1*  1/2006 Lee ................... H01L 21/76813
                                                         438/638
2016/0372531 A1* 12/2016 Shen ................... H01L 27/1288

FOREIGN PATENT DOCUMENTS

TW          364185 B      7/1999
TW          503547 B      9/2002

OTHER PUBLICATIONS

Office Action mailed on May 3, 2023 related to Taiwanese Application No. 111119722.

* cited by examiner

*Primary Examiner* — Jonathan Han
(74) *Attorney, Agent, or Firm* — Xuan Zhang

(57) ABSTRACT

The present application discloses a method for fabricating a semiconductor device. The method includes: providing a photomask comprising an opaque layer on a mask substrate and surrounding a translucent layer on the mask substrate; providing a device stack comprising a first dielectric layer on a substrate, a first etch stop layer on the first dielectric layer, and a second dielectric layer on the first etch stop layer; forming a pre-process mask layer on the device stack; patterning the pre-process mask layer using the photomask to form a patterned mask layer comprising a mask region corresponding to the opaque layer, a trench region corresponding to the translucent layer, and a via hole corresponding to the mask opening of via feature. The method also includes performing a damascene etching process to form a via opening in the first dielectric layer and a trench opening in the second dielectric layer.

13 Claims, 34 Drawing Sheets

METHOD FOR FABRICATING SEMICONDUCTOR DEVICE WITH DAMASCENE STRUCTURE BY USING ETCH STOP LAYER

TECHNICAL FIELD

The present disclosure relates to a method for fabricating a semiconductor device, and more particularly, to a method for fabricating a semiconductor device with a damascene structure by using an etch stop layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for fabricating a semiconductor device including providing a photomask including an opaque layer on a mask substrate and surrounding a translucent layer on the mask substrate; providing a device stack including a first dielectric layer on a substrate, and a second dielectric layer on the first dielectric layer; forming a pre-process mask layer on the device stack; patterning the pre-process mask layer using the photomask to form a patterned mask layer including a mask region corresponding to the opaque layer, a trench region corresponding to the translucent layer, and a via hole corresponding to the mask opening of via feature; performing a damascene etching process to form a via opening in the first dielectric layer and a trench opening in the second dielectric layer; and forming a via in the via opening and a trench in the trench opening to configure the semiconductor device. The translucent layer includes a mask opening of via feature which exposes a portion of the mask substrate. A thickness of the trench region is less than a thickness of the mask region.

Another aspect of the present disclosure provides a method for fabricating a semiconductor device including providing a photomask including a translucent layer on a mask substrate and including a mask opening of via feature which exposes a portion of the mask substrate, and an opaque layer on the translucent layer and including a mask opening of trench feature which exposes a portion of the translucent layer and the portion of the mask substrate; providing a device stack including a first dielectric layer on a substrate, and a second dielectric layer on the first dielectric layer; forming a pre-process mask layer on the device stack; patterning the pre-process mask layer using the photomask to form a patterned mask layer including a mask region corresponding to the opaque layer, a trench region corresponding to the portion of the translucent layer, and a via hole corresponding to the mask opening of via feature; performing a damascene etching process to form a via opening in the first dielectric layer and a trench opening in the second dielectric layer; and forming a via in the via opening and a trench in the trench opening to configure the semiconductor device. A thickness of the trench region is less than a thickness of the mask region.

Another aspect of the present disclosure provides a method for fabricating a semiconductor device including providing a photomask including an opaque layer on a mask substrate and surrounding a translucent layer on the mask substrate; providing a device stack including a first dielectric layer on a substrate, a first etch stop layer on the first dielectric layer, and a second dielectric layer on the first etch stop layer; forming a pre-process mask layer on the device stack; patterning the pre-process mask layer using the photomask to form a patterned mask layer including a mask region corresponding to the opaque layer, a trench region corresponding to the translucent layer, and a via hole corresponding to the mask opening of via feature; performing a damascene etching process to form a via opening along the first etch stop layer and the first dielectric layer, and a trench opening in the second dielectric layer; and forming a via in the via opening and a trench in the trench opening to configure the semiconductor device. The translucent layer includes a mask opening of via feature which exposes a portion of the mask substrate. A thickness of the trench region is less than a thickness of the mask region.

Another aspect of the present disclosure provides a method for fabricating a photomask including providing a mask substrate; forming an opaque layer on the mask substrate; pattern-writing the opaque layer to form a mask opening of trench feature in the opaque layer and expose the mask substrate; forming a translucent layer in the mask opening of trench feature to cover the mask substrate; and pattern-writing the translucent layer to form a mask opening of via feature to expose a portion of the mask substrate.

Due to the design of the method for fabricating the semiconductor device of the present disclosure, the via opening and the trench opening of the semiconductor device may be formed in a single step damascene etching process by employing the photomask including the translucent layer. As a result, the process complexity for fabricating the semiconductor device may be reduced. In addition, by employing the first etch stop layer, the undesired removal of the first dielectric layer may be alleviated or avoided. In other words, the loading effect may be alleviated or avoided during the damascene etching process. As a result, the reliability and quality of the result semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
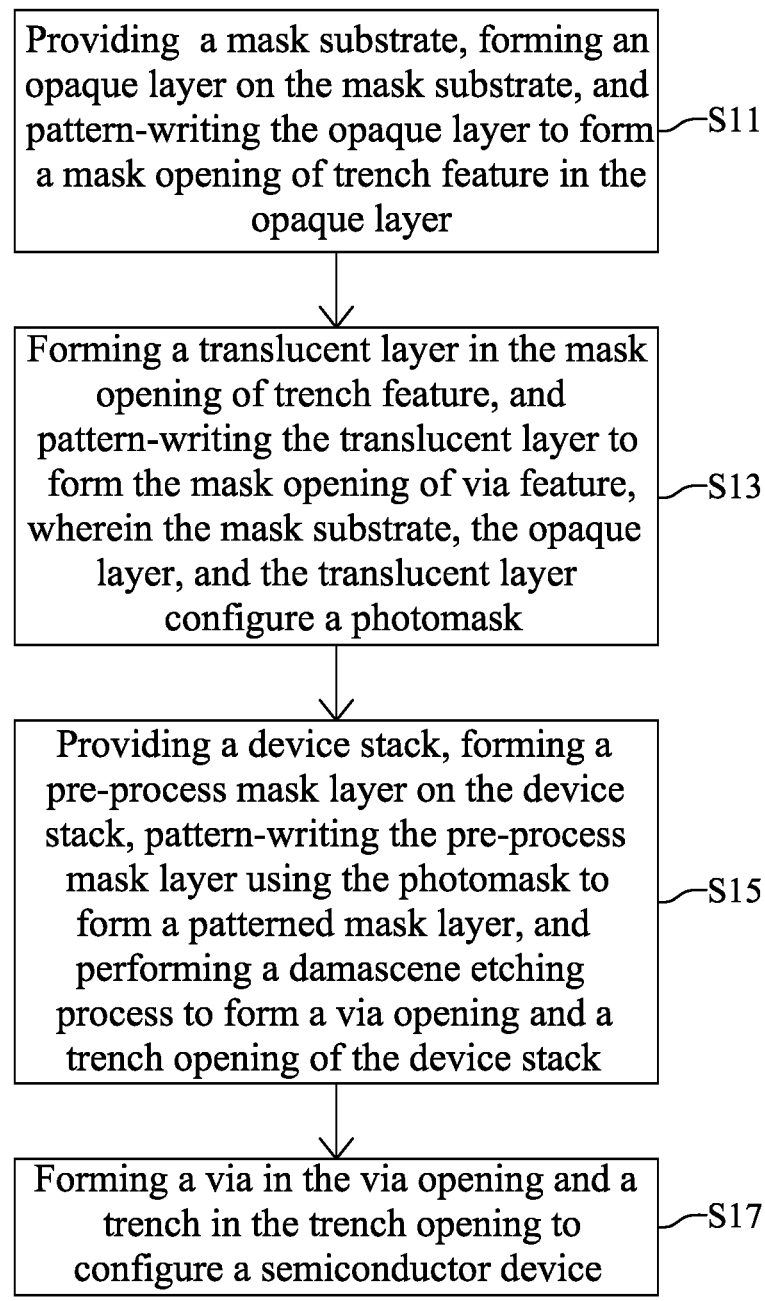
FIG. 1 illustrates, in a flowchart diagram form, a method for fabricating a semiconductor device using a photomask in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two FIGS. shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 200A using a photomask 100A in accordance with one embodiment of the present disclosure. FIGS. 2 to 10 illustrate, in schematic cross-sectional view diagrams, a flow for fabricating the semiconductor device 200A using the photomask 100A in accordance with one embodiment of the present disclosure.

Figure 2:
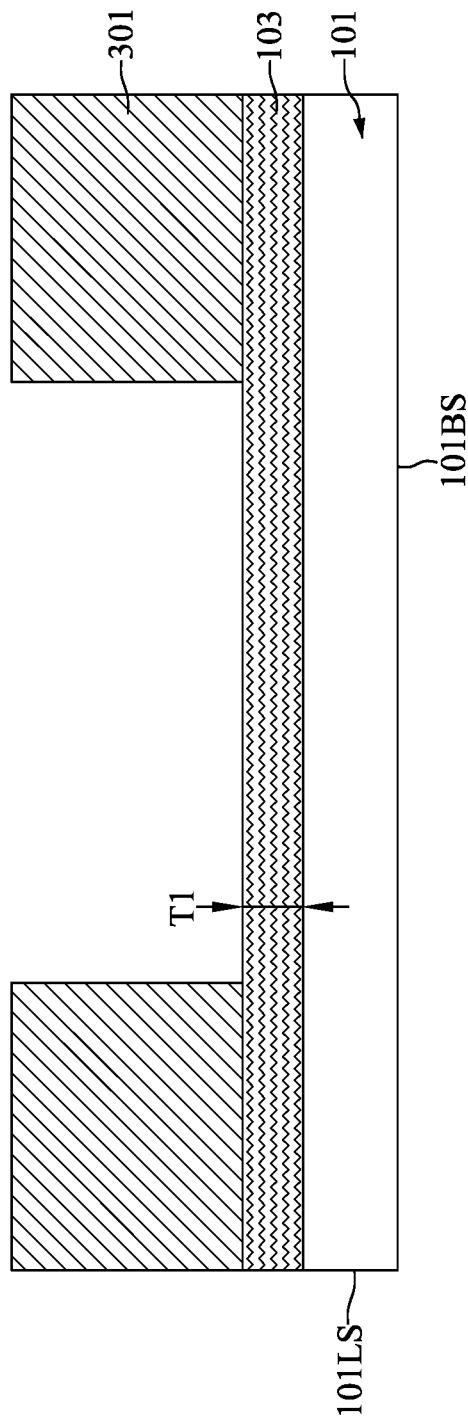
FIGS. 2 to 10 illustrate, in schematic cross-sectional view diagrams, a flow for fabricating the semiconductor device using the photomask in accordance with one embodiment of the present disclosure.
Figure 3:
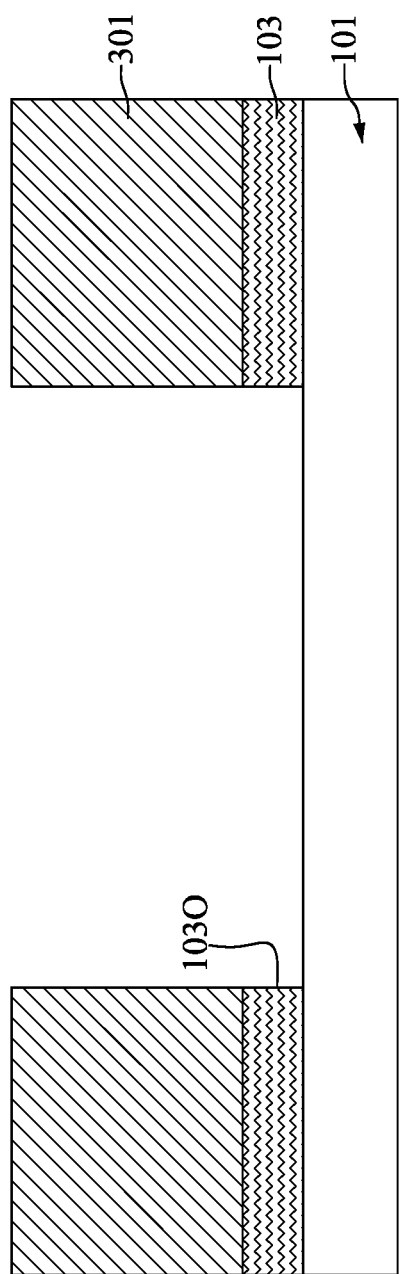

With reference to FIGS. 1 to 3, at step S11, a mask substrate 101 may be provided, an opaque layer 103 may be formed on the mask substrate 101, and the opaque layer 103 may be pattern-written to form a mask opening 103O of trench feature in the opaque layer 103.

With reference to FIG. 2, the mask substrate 101 may be formed of, for example, quartz, glass, or any other substantially transparent material. The glass may be, for example, aluminosilicate glass, calcium fluoride or magnesium fluoride and soda lime glass. In some embodiments, the thickness of the mask substrate 101 may be between about 0.125 inch and about 0.25 inch.

With reference to FIG. 2, the opaque layer 103 may be formed on the mask substrate 101. The opaque layer 103 may be formed of, for example, chrome or other suitable materials that is sufficiently opaque to an incident wavelength of an energy source of an exposure process of a photolithography process as will be illustrated later. In some embodiments, the opaque layer 103 may be formed by, for example, chemical vapor deposition, radio frequency sputtering, or other suitable deposition process. In some embodiments, the thickness T1 of the opaque layer 103 may be between about 500 Angstroms and about 1000 Angstroms. In some embodiments, the opacity of the opaque layer 103 may be 100% or substantially about 100%.

In some embodiments, alternatively, the opaque layer 103 may be formed by an electroplating process. Detailedly, the mask substrate 101 may be coated with a covering layer (not shown) on the bottom surface 101BS and the lateral surface 101LS of the mask substrate 101. Then, the mask substrate 101 coated with the covering layer may be soft baked to enhance the adhesion between the mask substrate 101 and the covering layer, and to drive off all solvent in the covering layer. Subsequently, the mask substrate 101 coated with the covering layer may be immersed in the electroless chrome plating activator for surface activation. Suitable electroless chrome plating activator may be an alkaline solution of chromium chloride and 2-propanol. The activated mask substrate 101 coated with the covering layer may be then immersed in the electroless chrome plating solution for being coated with the opaque layer 103. After the opaque layer 103 is formed on the mask substrate 101 coated with the covering layer, the covering layer may be stripped from the mask substrate 101.

With reference to FIG. 2, a first mask layer 301 may be formed on the opaque layer 103 by a photolithography process. The first mask layer 301 may include a pattern of the mask opening 103O of trench feature. In some embodiments, the first mask layer 301 may be a photoresist such as commercially available photoresist OCG895i or other suitable photoresists.

With reference to FIG. 3, a trench-etching process using the first mask layer 301 as a mask may be performed to remove a portion of the opaque layer 103. After the trench-etching process, the mask opening 103O of trench feature may be formed in the opaque layer 103. A first portion of the top surface of the mask substrate 101 may be exposed through the mask opening 103O of trench feature. In some embodiments, the etch rate ratio of the opaque layer 103 to the mask substrate 101 may be between about 100:1 and about 1.05:1, between about 15:1 and about 2:1, or between about 10:1 and about 2:1 during the trench-etching process. After the mask opening 103O of trench feature is formed, the first mask layer 301 may be removed.

With reference to FIG. 1 and FIGS. 4 to 6, at step S13, a translucent layer 105 may be formed in the mask opening 103O of trench feature, and the translucent layer 105 may be pattern-written to form the mask opening 105O of via feature, wherein the mask substrate 101, the opaque layer 103, and the translucent layer 105 together configure a photomask 100.

Figure 4:
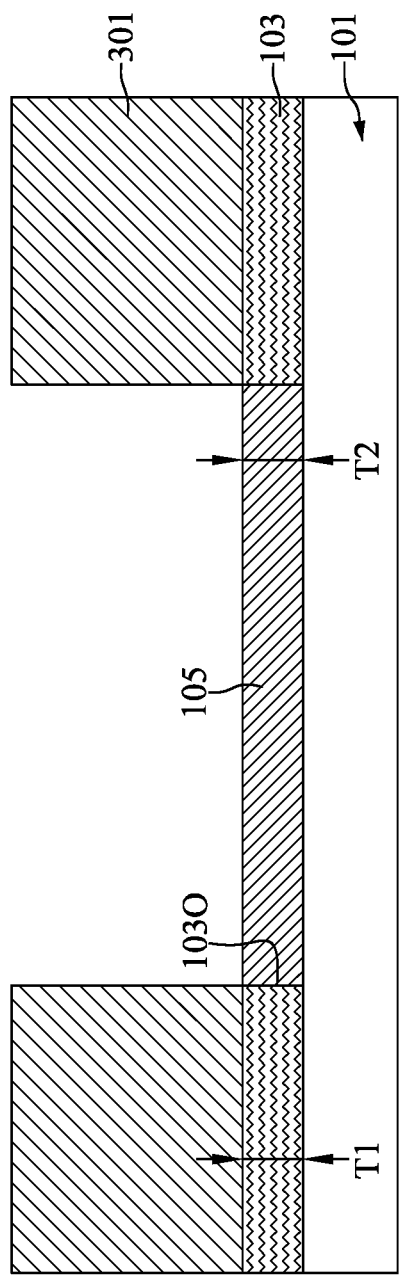

With reference to FIG. 4, the translucent layer 105 may include, for example, molybdenum silicide or silicon nitride. In some embodiments, the translucent layer 105 may be formed by, for example, chemical vapor deposition, sputtering, or other applicable deposition. In some embodiments, the first mask layer 301 may be removed after the formation of the translucent layer 105.

In some embodiments, the thickness T2 of the translucent layer 105 may be substantially the same as the thickness T1 of the opaque layer 103. In some embodiments, the thickness T2 of the translucent layer 105 and the thickness T1 of the opaque layer 103 may be different. For example, the thickness T2 of the translucent layer 105 may be greater than or less than the thickness T1 of the opaque layer 103. In some embodiments, the opacity ratio of the opacity of the translucent layer 105 to the opacity of the opaque layer 103 may be between about 5% and about 95%. In some embodiments, the opacity ratio of the opacity of the translucent layer 105 to the opacity of the opaque layer 103 may be between about 45% and about 75%. It should be noted that the exposed first portion of the top surface of the mask substrate 101 may be completely covered by the translucent layer 105 in the current stage.

Figure 5:
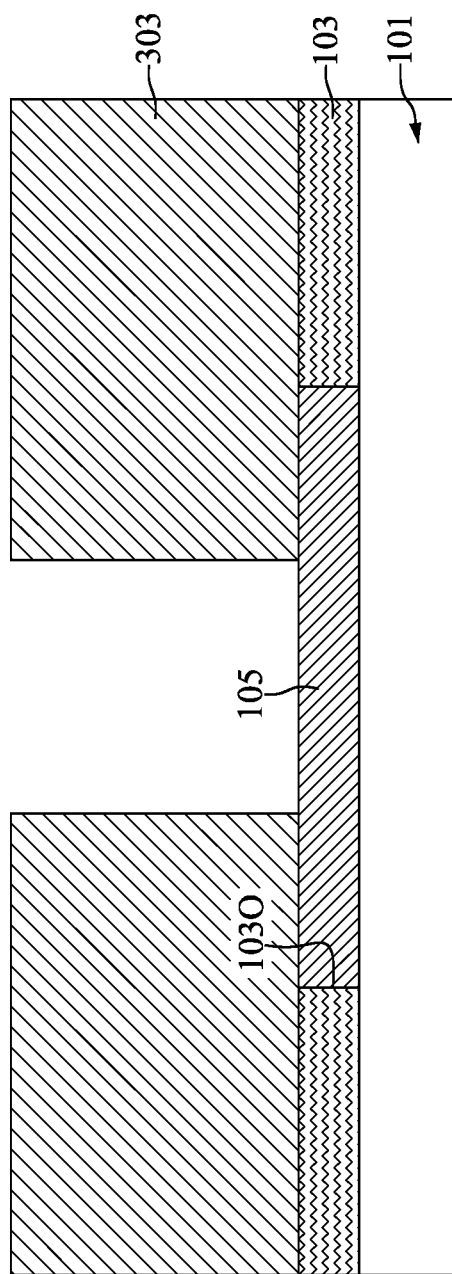

With reference to FIG. 5, a second mask layer 303 may be formed by a photolithography process to cover the opaque layer 103 and a portion of the translucent layer 105. The second mask layer 303 may include a pattern of the mask opening 105O of via feature. In some embodiments, the second mask layer 303 may be a photoresist such as commercially available photoresist OCG895i or other suitable photoresists.

Figure 6:
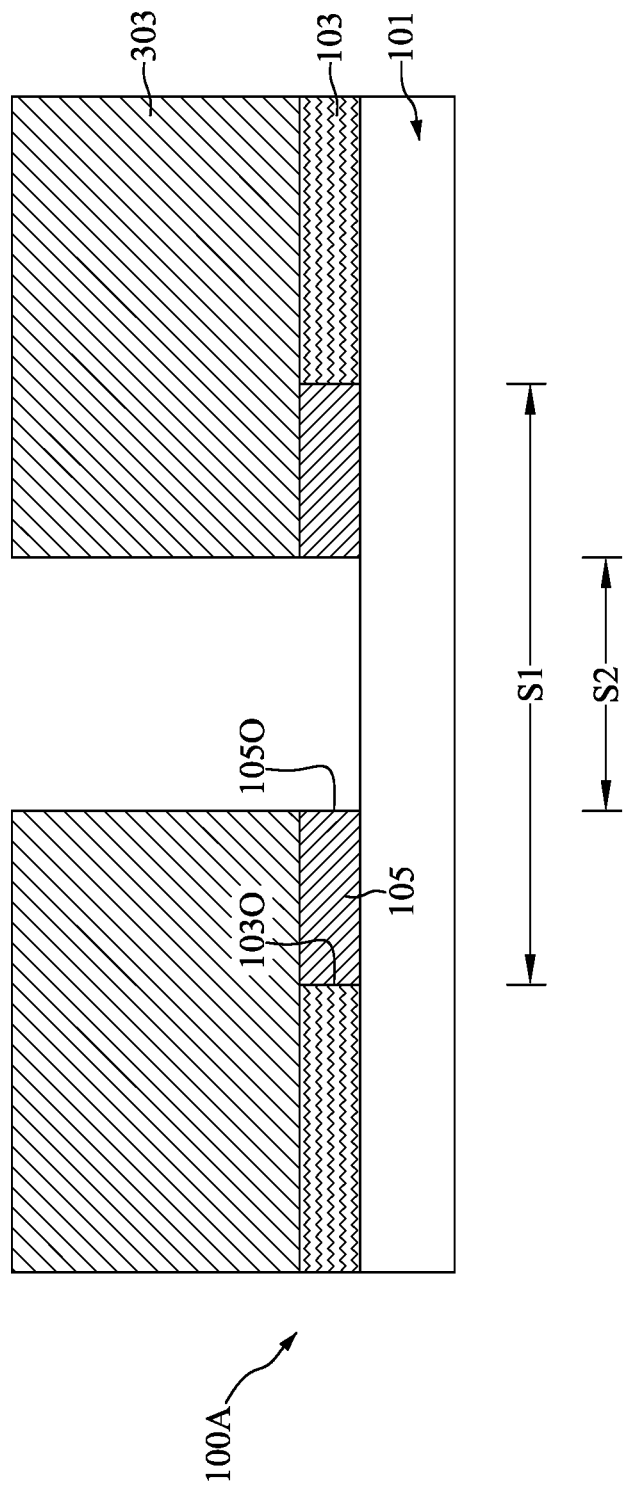

With reference to FIG. 6, a via-etching process using the second mask layer 303 as a mask may be performed to remove the exposed portion of the translucent layer 105. After the via-etching process, the mask opening 105O of via feature may be formed in the translucent layer 105. A second portion of the top surface of the mask substrate 101 may be exposed through the mask opening 105O of via feature. In some embodiments, the etch rate ratio of the translucent layer 105 to the mask substrate 101 may be between about 100:1 and about 1.05:1, between about 15:1 and about 2:1, or between about 10:1 and about 2:1 during the via-etching process. After the mask opening 105O of via feature is formed, the second mask layer 303 may be removed. The surface area S1 of the first portion of the top surface of the mask substrate 101 is greater than the surface area S2 of the second portion of the top surface of the mask substrate 101.

With reference to FIG. 1 and FIGS. 7 to 9, at step S15, a device stack SKA may be provided, a pre-process mask layer 401 may be formed on the device stack SKA, the pre-process mask layer 401 may be pattern-written using the photomask 100A to form a patterned mask layer 403, and a damascene etching process may be performed to form a via opening 203O and a trench opening 205O of the device stack SKA.

Figure 7:
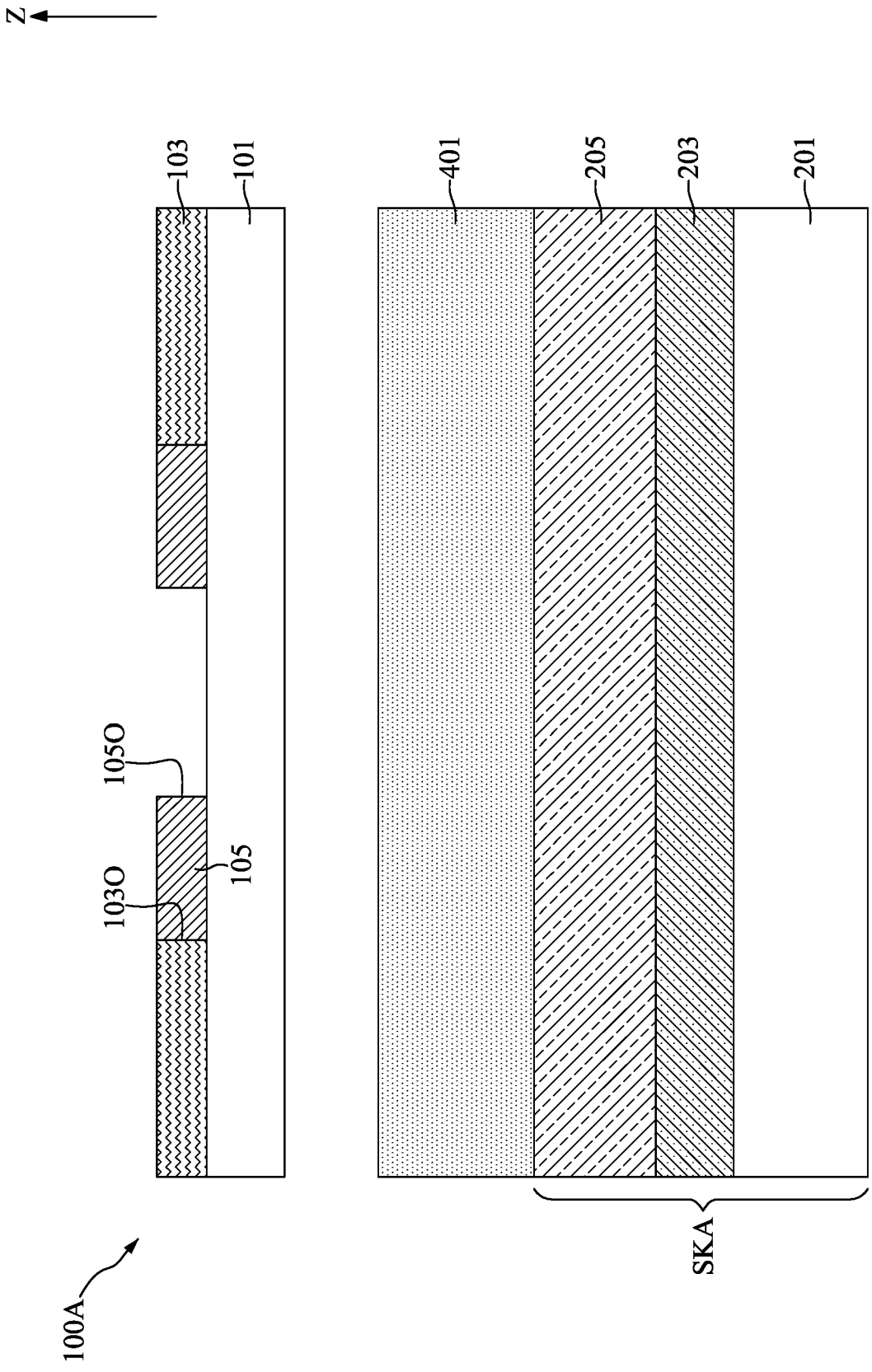

With reference to FIG. 7, the device stack SKA may include a substrate 201, a first dielectric layer 203, and a second dielectric layer 205. In some embodiments, the substrate 201 may include a bulk semiconductor substrate that is composed entirely of at least one semiconductor material, a plurality of device elements (not show for clarity), a plurality of dielectric layers (not shown for clarity), and a plurality of conductive features (not show for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 201 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 7, the plurality of device elements may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

With reference to FIG. 7, the plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 7, the plurality of conductive features may include interconnect layers and conductive vias. The interconnect layers may be separated from each other and may be horizontally disposed in the plurality of dielectric layers along the direction Z. The conductive vias may connect adjacent interconnect layers along the direction Z, and adjacent device element and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units in the substrate 201. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 7, in some embodiments, the first dielectric layer 203 may be formed on the substrate 201 and may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the first dielectric layer 203 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 203 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIG. 7, in some embodiments, the second dielectric layer 205 may be formed on the first dielectric layer 203 and may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the second dielectric layer 205 may include a self-planarizing material such as a spin-on glass or a spin-on low-k dielectric material such as SiLK™. The use of a self-planarizing dielectric material may avoid the need to perform a subsequent planarizing step. In some embodiments, the second dielectric layer 205 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

In some embodiments, the thickness of the second dielectric layer 205 may be greater than the thickness of the first dielectric layer 203.

With reference to FIG. 7, the pre-process mask layer 401 may be formed on the second dielectric layer 205 by, for example, spin-on coating. A soft bake process may be performed to drive out solvent remaining in the pre-process mask layer 401. In some embodiments, the pre-process mask layer 401 may be a photoresist such as commercially available photoresist OCG895i or other suitable photoresists.

With reference to FIG. 7, the photomask 100A may be positioned over the device stack SKA and align with the device stack SKA.

Figure 8:
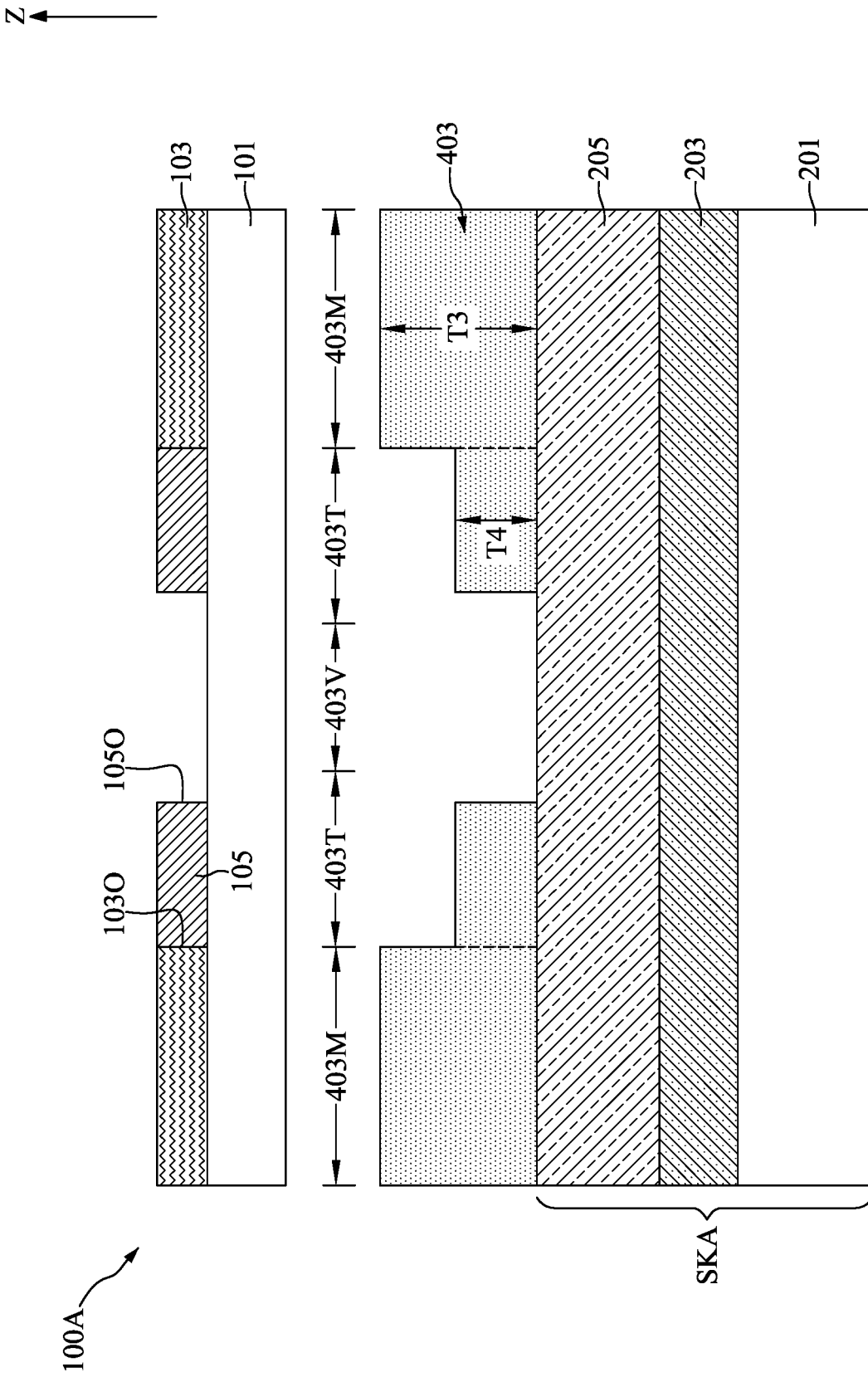

With reference to FIG. 8, an exposure process may be performed using the photomask 100. The exposure process may be performed using a radiation source. The radiation source may be, for example, ultraviolet radiation, deep ultraviolet radiation (typically 193 nm or 248 nm), or extreme ultraviolet radiation (typically 13.5 nm). A post-exposure bake process may be immediately performed after the exposure process. Subsequently, a development process may be performed. During the development process, an aqueous base solution may be added to the exposed and baked pre-process mask layer 401, and a portion of the pre-process mask layer 401 may be dissolved. After the exposure process, the post-exposure bake process, and the development process, the pre-process mask layer 401 may be turned into the patterned mask layer 403.

With reference to FIG. 8, the patterned mask layer 403 may include a mask region 403M, a trench region 403T, and a via hole 403V. The mask region 403M may surround the trench region 403T. The mask region 403M may correspond to the opaque layer 103. That is, the mask region 403M and the opaque layer 103 may be completely overlapped to each other in a top-view perspective (not shown). The trench region 403T may correspond to the translucent layer 105. That is, the trench region 403T and the translucent layer 105 may be completely overlapped to each other in a top-view perspective (not shown). The space surrounded by the trench region 403T is referred to as the via hole 403V. A portion of the top surface of the second dielectric layer 205 may be exposed through the via hole 403V. The via hole 403V may correspond to the mask opening 105O of via feature. That is, the via hole 403V and the mask opening 105O of via feature may be completely overlapped to each other in a top-view perspective (not shown).

In some embodiments, the thickness T3 of the mask region 403M may be greater than the thickness T4 of the trench region 403T. In some embodiments, the thickness ratio of the thickness T4 of the trench region 403T to the thickness T3 of the mask region 403M may be between about 25% and about 85%. In some embodiments, the thickness ratio of the thickness T4 of the trench region 403T to the thickness T3 of the mask region 403M may be between about 45% and about 65%.

Figure 9:
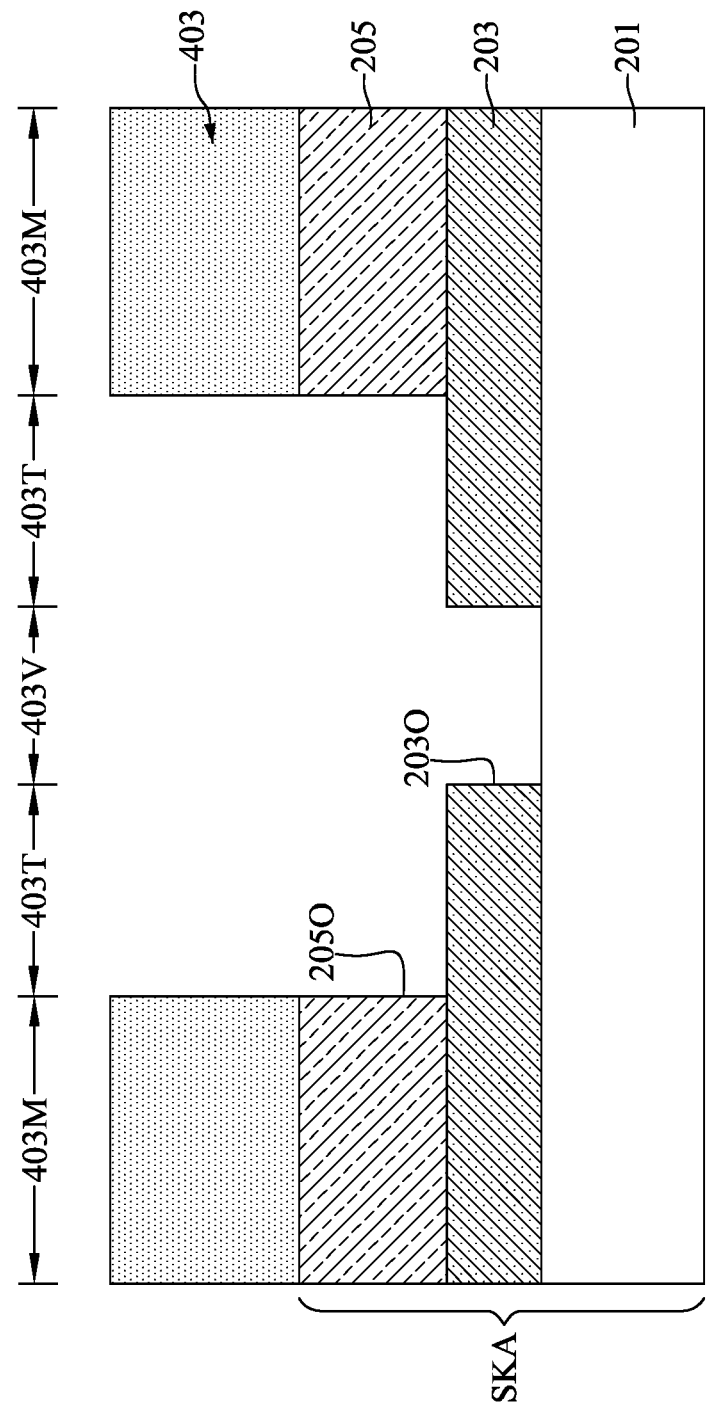

With reference to FIG. 9, the damascene etching process may be performed using the patterned mask layer 403 as a mask. In some embodiments, the etch rate of the first dielectric layer 203 and the etch rate of the second dielectric layer 205 during the damascene etching process may be substantially the same. In some embodiments, the etch rate ratio of the second dielectric layer 205 to the substrate 201 may be between about 100:1 and about 1.05:1, between about 15:1 and about 2:1, or between about 10:1 and about 2:1 during the damascene etching process. In some embodiments, the etch rate ratio of the first dielectric layer 203 to the substrate 201 may be between about 100:1 and about 1.05:1, between about 15:1 and about 2:1, or between about 10:1 and about 2:1 during the damascene etching process.

During the damascene etching process, the first dielectric layer 203 and the second dielectric layer 205 under the trench region 403T may be temporarily protected by the trench region 403T of the patterned mask layer 403. Detailedly, in beginning of the damascene etching process, the trench region 403T of the patterned mask layer 403 may serve as an etching buffer to protect the underneath second dielectric layer 205. However, the trench region 403T of the patterned mask layer 403 may be continually consumed during the damascene etching process. After the trench region 403T of the patterned mask layer 403 is completely consumed, the second dielectric layer 205 corresponding to the trench region 403T is removed.

In contrast, for the first dielectric layer 203 and the second dielectric layer 205 corresponding to the via hole 403V of the patterned mask layer 403, no patterned mask layer 403 is present to serve as a temporary etching buffer. Hence, in beginning of the damascene etching process, the second dielectric layer 205 corresponding to the via hole 403V is removed while the second dielectric layer 205 corresponding to the trench region 403T is still protected by the trench region 403T of the patterned mask layer 403. As a result, after the damascene etching process, the first dielectric layer 203 and the second dielectric layer 205 corresponding to the via hole 403V may be both removed and only the second dielectric layer 205 corresponding to the trench region 403T may be removed. The first dielectric layer 203 corresponding to the trench region 403T is intact or slightly removed.

After the damascene etching process, the via opening 203O may be formed in the first dielectric layer 203. A portion of the substrate 201 may be exposed through the via opening 203O. The trench opening 205O may be formed in the second dielectric layer 205. A portion of the first dielectric layer 203 and the portion of the substrate 201 may be exposed through the trench opening 205O. The patterned mask layer 403 may be removed after the via opening 203O and the trench opening 205O are formed.

Conventionally, the via opening 203O and the trench opening 205O may be formed separately by using multiple etching steps. In contrast, in the present embodiment, the via opening 203O and the trench opening 205O may be formed by using a single damascene etching process due to the employment of the photomask 100 with the translucent layer 105.

Figure 10:
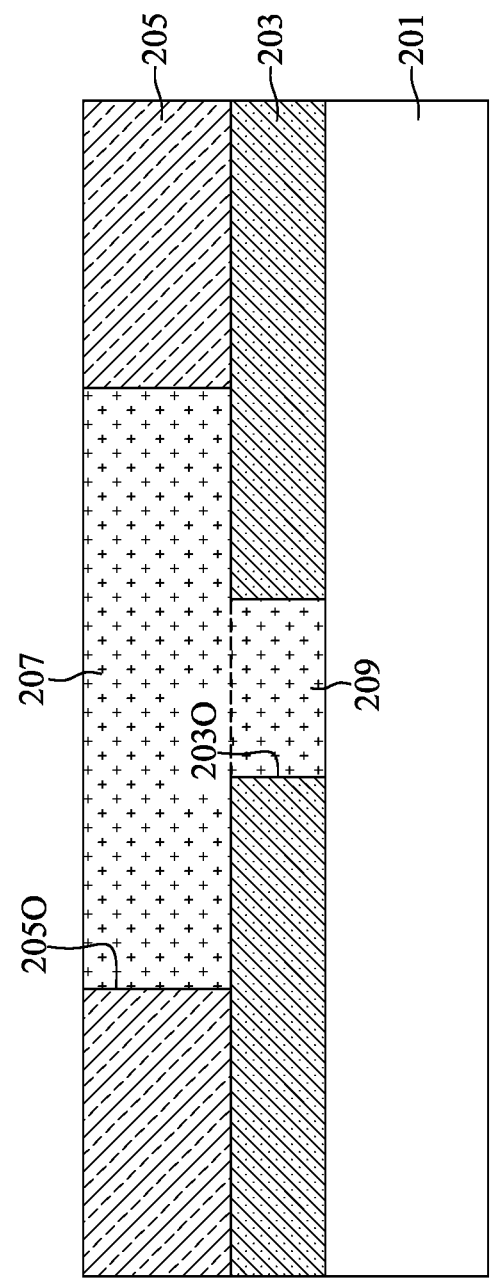

With reference to FIGS. 1 and 10, at step S17, a via 209 may be formed in the via opening 203O and a trench 207 may be formed in the trench opening 205O to configure the semiconductor device 200A.

With reference to FIG. 10, a conductive material may be deposited into the via opening 203O and the trench opening 205O by a deposition process. The conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. After the deposition process, a planarization process, such as chemical mechanical polishing, may be performed to remove excess material, provide a substantially flat surface for subsequent processing steps, and conformally form the via 209 in the via opening 203O and the trench 207 in the trench opening 205O. The substrate 201, the first dielectric layer 203, the second dielectric layer 205, the trench 207, and the via 209 together configure the semiconductor device 200A.

FIGS. 11 to 14 illustrate, in schematic cross-sectional view diagrams, a flow for fabricating a semiconductor device 200B using a photomask 100B in accordance with another embodiment of the present disclosure.

Figure 11:
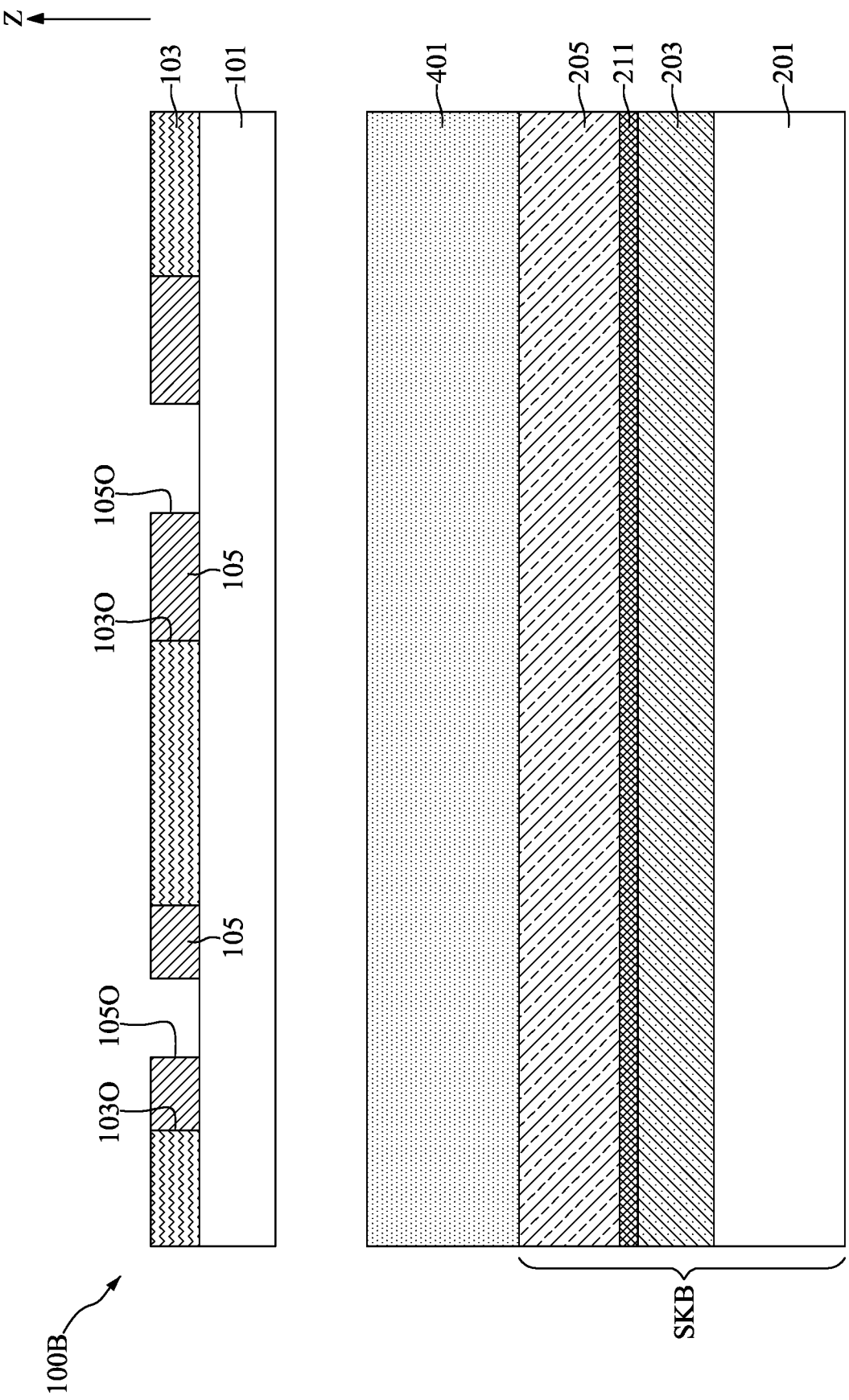
FIGS. 11 to 14 illustrate, in schematic cross-sectional view diagrams, a flow for fabricating a semiconductor device using a photomask in accordance with another embodiment of the present disclosure.

With reference to FIG. 11, the device stack SKB and the photomask 100B may have structures similar to that illustrated in FIG. 7. The same or similar elements in FIG. 11 as in FIG. 7 have been marked with similar reference numbers and duplicative descriptions have been omitted.

With reference to FIG. 11, the device stack SKB may include a first etch stop layer 211. The first etch stop layer 211 may be formed between the first dielectric layer 203 and the second dielectric layer 205. The first etch stop layer 211 may be preferably formed of a dielectric material having a different etch selectivity from the first dielectric layer 203 and/or the second dielectric layer 205. For example, the first etch stop layer 211 may be formed of silicon nitride, silicon carbonitride, silicon oxycarbide, or the like, and may be deposited by chemical vapor deposition or plasma enhanced chemical vapor deposition.

Figure 12:
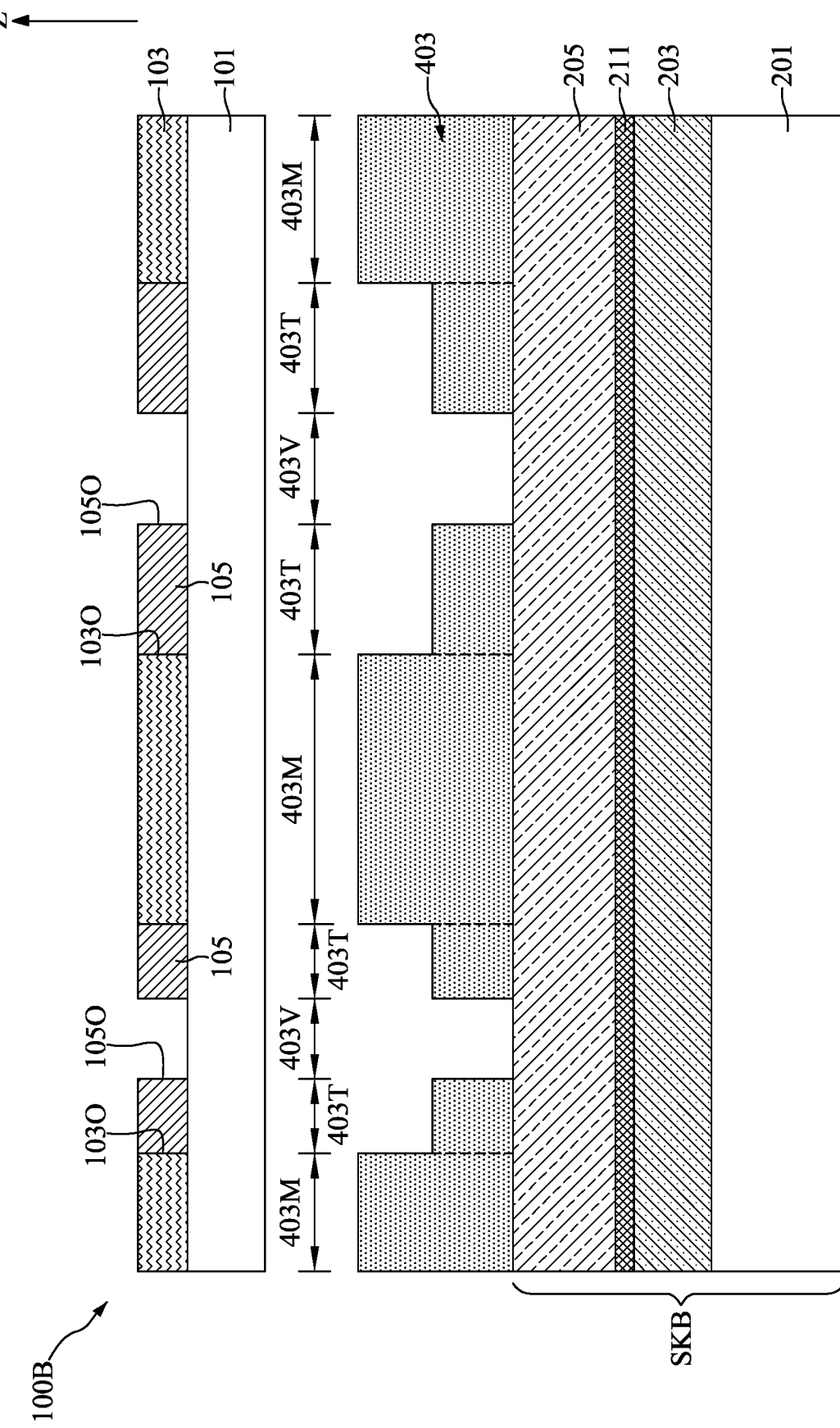

With reference to FIG. 12, the pre-process mask layer 401 may be pattern-written to form the patterned mask layer 403 with a procedure similar to that illustrated in FIG. 8, and descriptions thereof are not repeated herein.

Figure 13:
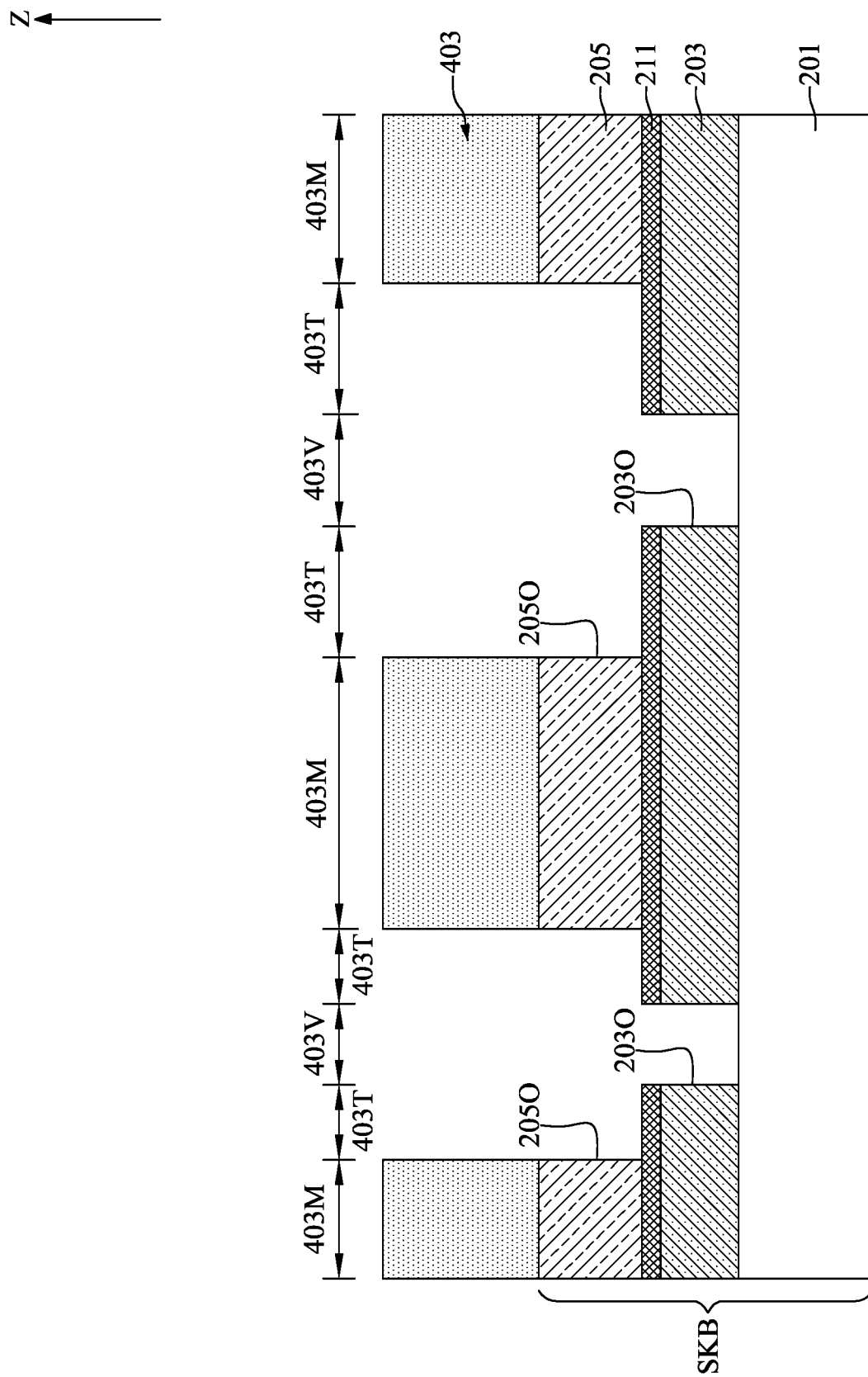

With reference to FIG. 13, in some embodiments, the damascene etching process may be performed with a procedure similar to that illustrated in FIG. 9, and descriptions thereof are not repeated herein.

In some embodiments, the damascene etching process may include multiple stages such as three stages. The etch rates of the first dielectric layer 203, the second dielectric layer 205, and the first etch stop layer 211 may be different during different stages of the damascene etching process. For example, during the first stage of the damascene etching process, the etch rate ratio of the second dielectric layer 205 to the first etch stop layer 211 may be between about 100:1 and about 1.05:1, between about 15:1 and about 2:1, or between about 10:1 and about 2:1. During the second stage of the damascene etching process, the etch rate ratio of the first etch stop layer 211 to the first dielectric layer 203 and/or the second dielectric layer 205 may be between about 100:1 and about 1.05:1, between about 15:1 and about 2:1, or between about 10:1 and about 2:1. During the third stage of the damascene etching process, the etch rate ratio of the second dielectric layer 205 to the first etch stop layer 211 may be between about 100:1 and about 1.05:1, between about 15:1 and about 2:1, or between about 10:1 and about 2:1.

Accordingly, during the first stage and the second stage of the damascene etching process, the trench region 403T of the patterned mask layer 403 may be present and may protect the second dielectric layer 205 corresponding to the trench region 403T. In the third stage of the damascene etching process, the trench region 403T of the patterned mask layer 403 may be completely consumed and the second dielectric layer 205 corresponding to the trench region 403T may be removed.

By employing the first etch stop layer 211, the undesired removal of the first dielectric layer 203 may be alleviated or avoided and the trench openings 205O with different dimensions may be formed with the same depth. In other words, the loading effect may be alleviated or avoided during the damascene etching process. As a result, the reliability and quality of the result semiconductor device 200B may be improved.

Figure 14:
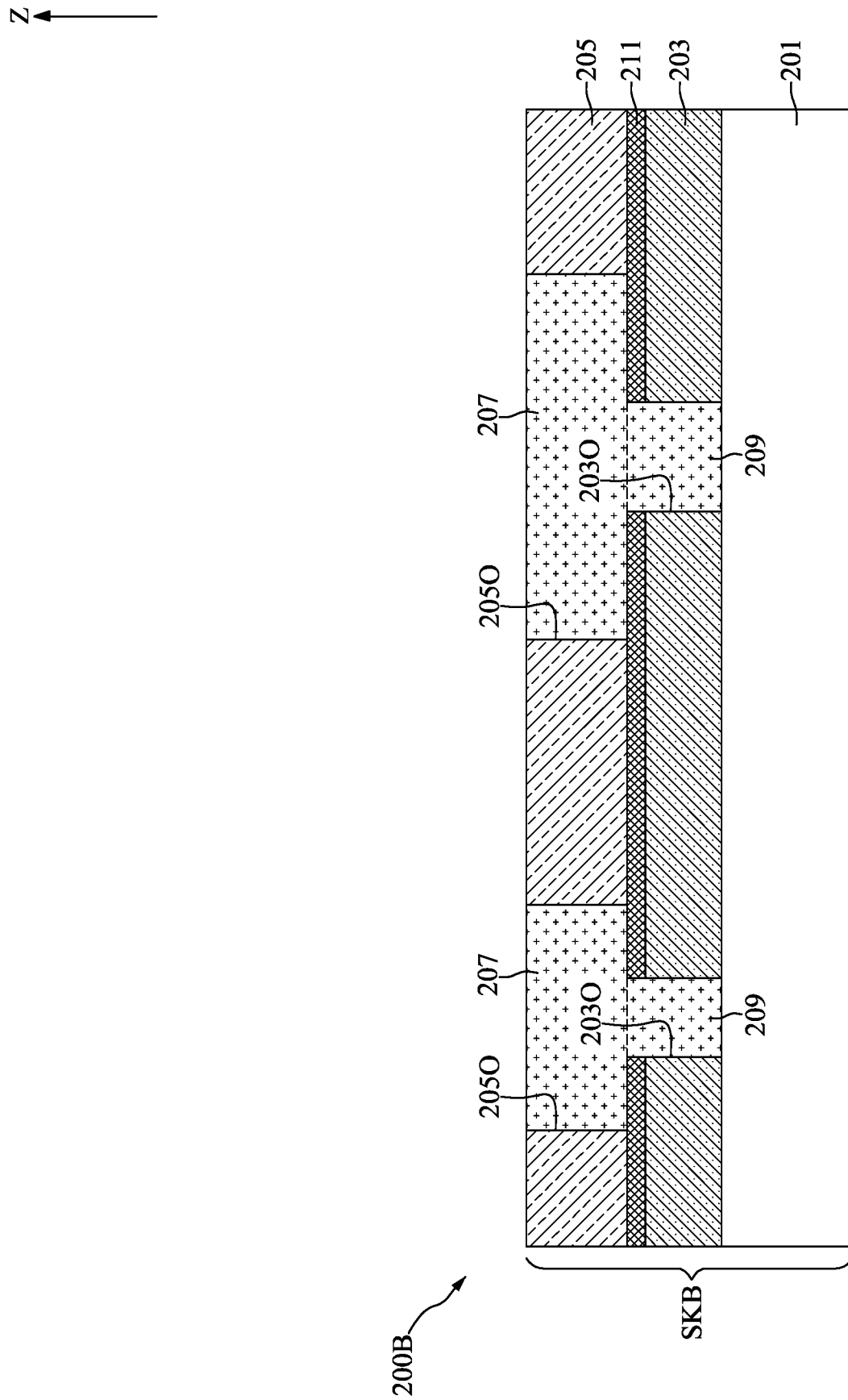

With reference to FIG. 14, the trenches 207 and the vias 209 may be formed with a procedure similar to that illustrated in FIG. 10, and descriptions thereof are not repeated herein. The substrate 201, the first dielectric layer 203, the second dielectric layer 205, the trenches 207, the vias 209, and the first etch stop layer 211 together configure the semiconductor device 200B.

FIGS. 15 to 18 illustrate, in schematic cross-sectional view diagrams, a flow for fabricating a semiconductor device 200C using a photomask 100C in accordance with another embodiment of the present disclosure.

Figure 15:
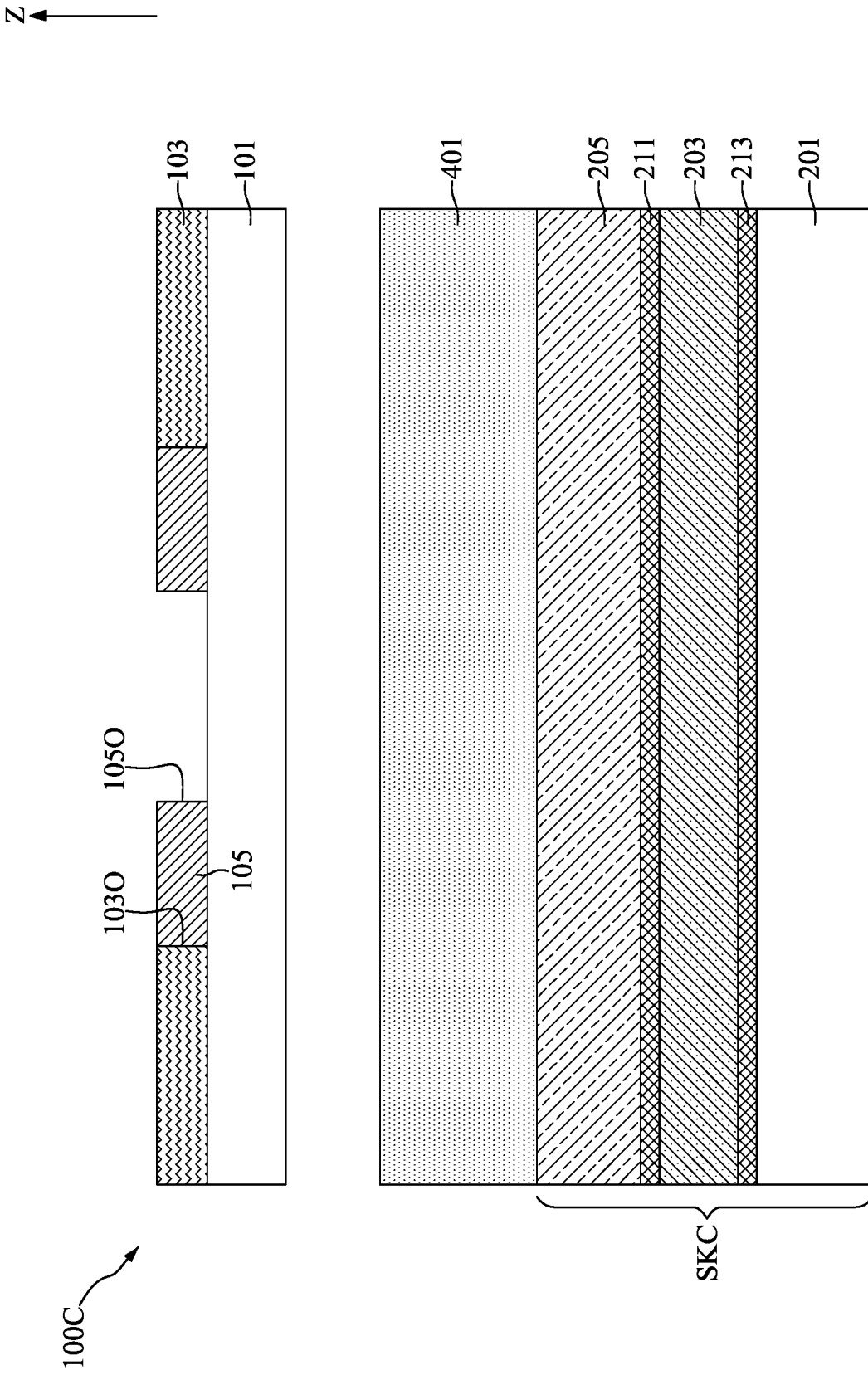
FIGS. 15 to 18 illustrate, in schematic cross-sectional view diagrams, a flow for fabricating a semiconductor device using a photomask in accordance with another embodiment of the present disclosure.

With reference to FIG. 15, the device stack SKC and the photomask 100C may have structures similar to that illustrated in FIG. 11. The same or similar elements in FIG. 15 as in FIG. 11 have been marked with similar reference numbers and duplicative descriptions have been omitted. The device stack SKC may include a second etch stop layer 213. The second etch stop layer 213 may be formed between the first dielectric layer 203 and the substrate 201. In some embodiments, the second etch stop layer 213 may be formed of the same material as the first etch stop layer 211. In some embodiments, the second etch stop layer 213 may be preferably formed of a dielectric material having a different etch selectivity from the first dielectric layer 203, the second dielectric layer 205, and/or the substrate 201. For example, the second etch stop layer 213 may be formed of silicon nitride, silicon carbonitride, silicon oxycarbide, or the like, and may be deposited by chemical vapor deposition or plasma enhanced chemical vapor deposition.

Figure 16:
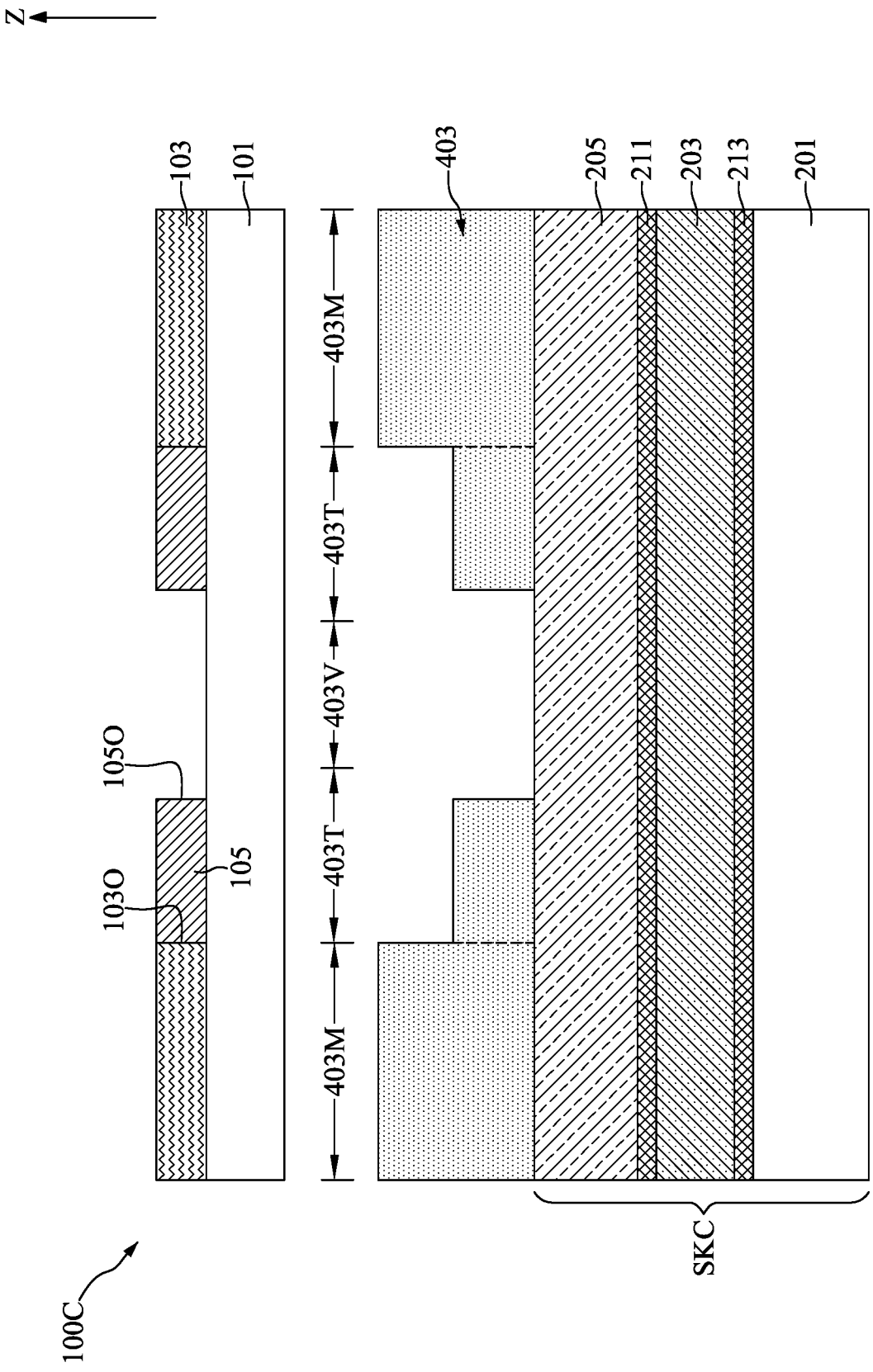

With reference to FIG. 16, the pre-process mask layer 401 may be pattern-written to form the patterned mask layer 403 with a procedure similar to that illustrated in FIG. 12, and descriptions thereof are not repeated herein.

Figure 17:
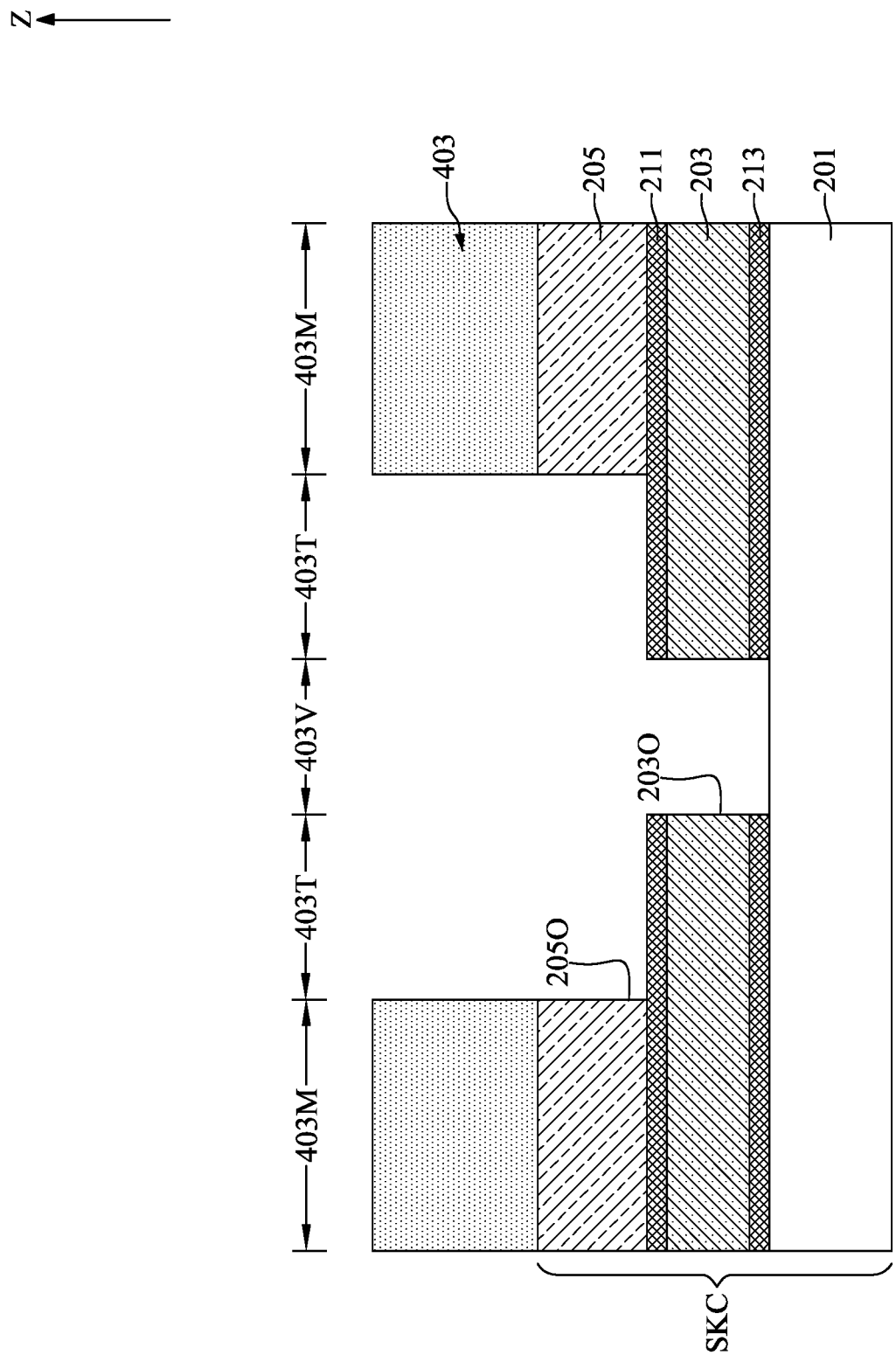

With reference to FIG. 17, in some embodiments, the damascene etching process may be performed with a procedure similar to that illustrated in FIG. 13, and descriptions thereof are not repeated herein.

Figure 18:
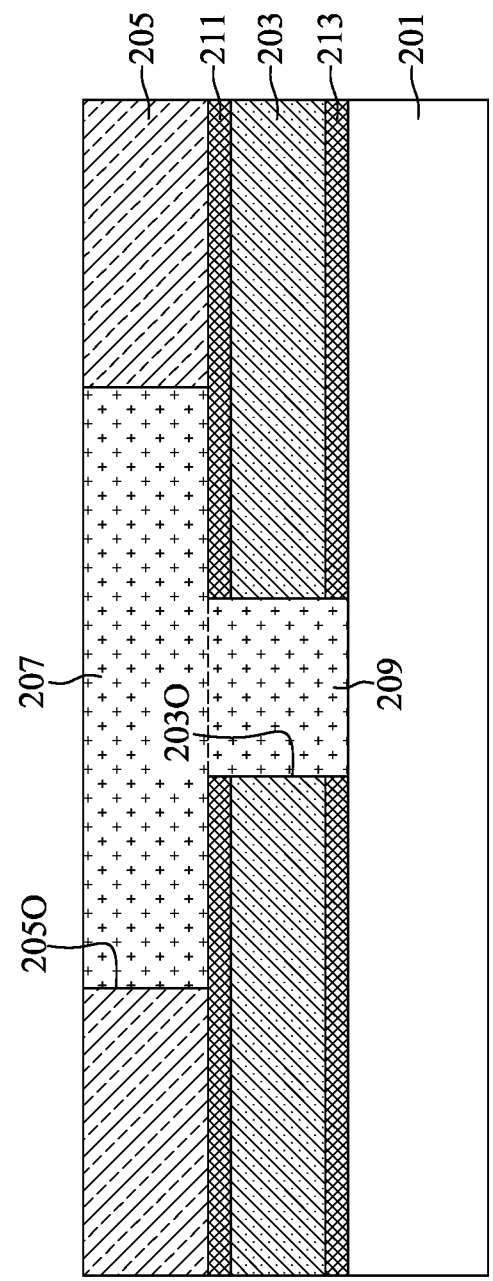

With reference to FIG. 18, the trench 207 and the via 209 may be formed with a procedure similar to that illustrated in FIG. 14, and descriptions thereof are not repeated herein. The substrate 201, the first dielectric layer 203, the second dielectric layer 205, the trench 207, the via 209, the first etch stop layer 211, and the second etch stop layer 213 together configure the semiconductor device 200B.

Figure 19:
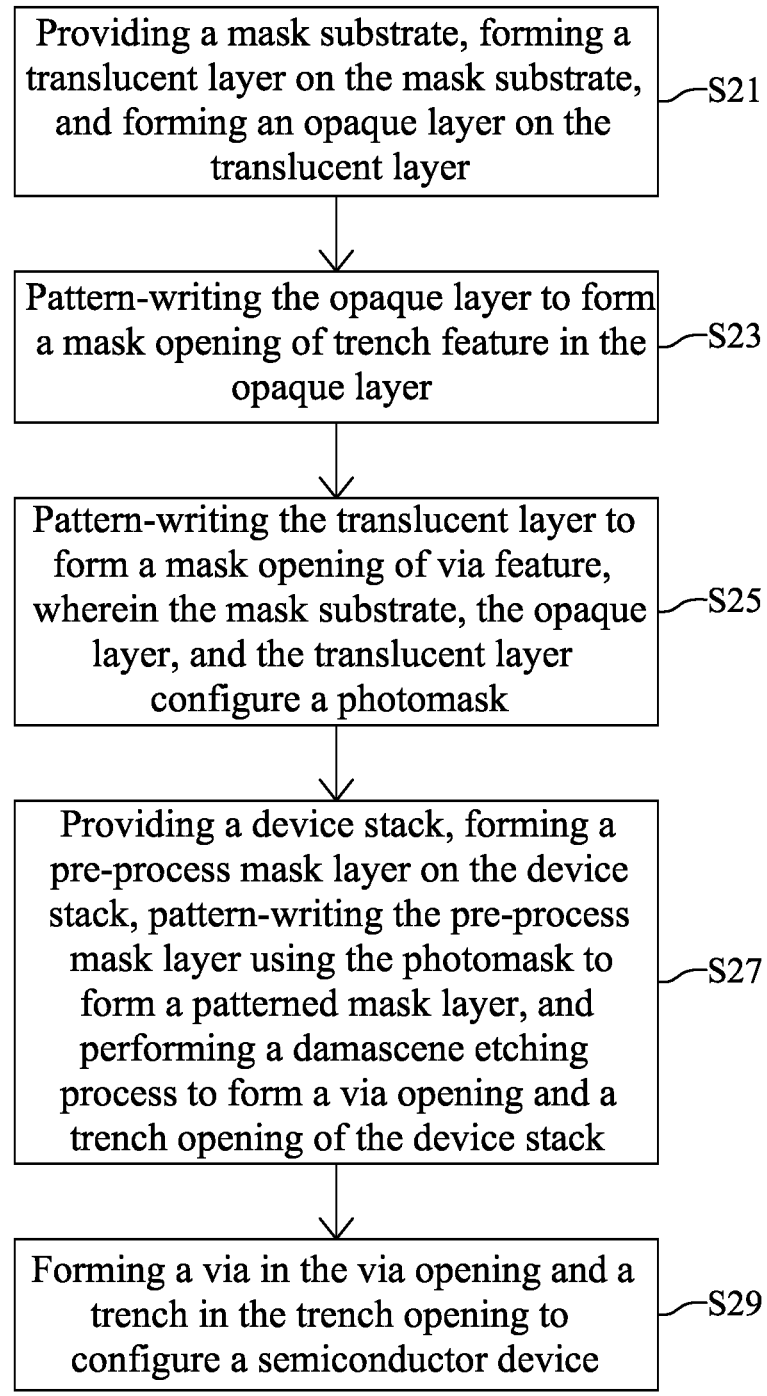
FIG. 19 illustrates, in a flowchart diagram form, a method for fabricating a semiconductor device using a photomask in accordance with another embodiment of the present disclosure.

FIG. 19 illustrates, in a flowchart diagram form, a method 20 for fabricating a semiconductor device 200D using a photomask 100D in accordance with another embodiment of the present disclosure. FIGS. 20 to 29 illustrate, in schematic cross-sectional view diagrams, a flow for fabricating the semiconductor device 200D using the photomask 100D in accordance with another embodiment of the present disclosure.

Figure 20:
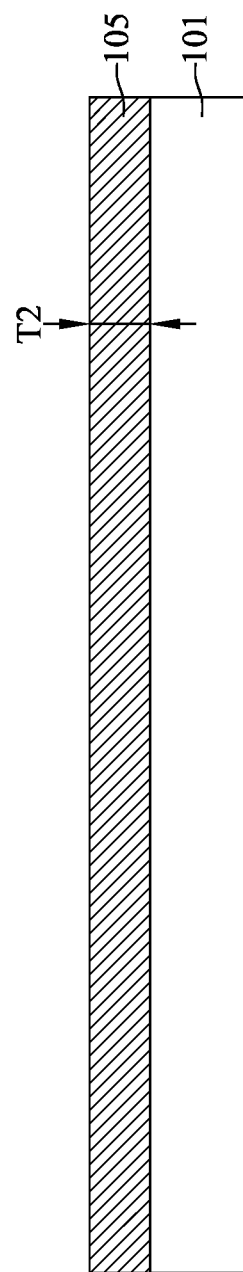
FIGS. 20 to 29 illustrate, in schematic cross-sectional view diagrams, a flow for fabricating the semiconductor device using the photomask in accordance with another embodiment of the present disclosure.
Figure 21:
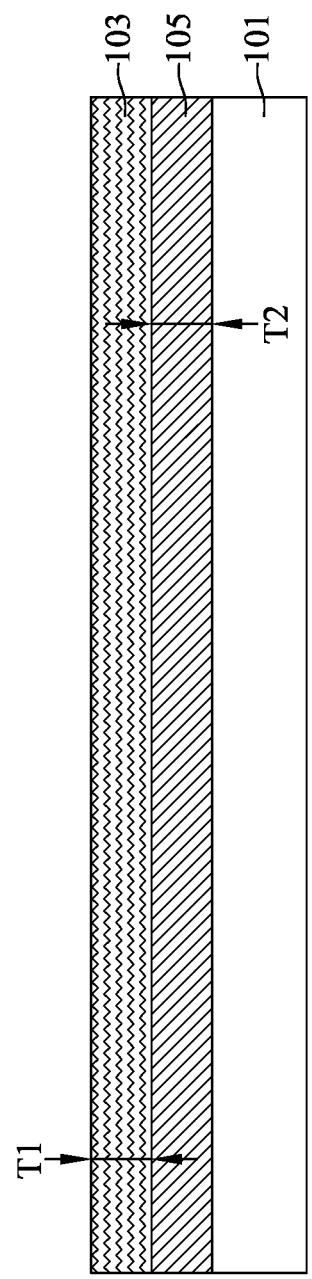

With reference to FIGS. 19 to 21, at step S21, a mask substrate 101 may be provided, a translucent layer 105 may be formed on the mask substrate 101, and an opaque layer 103 may be formed on the translucent layer 105.

With reference to FIG. 20, the mask substrate 101 may have a structure similar to the mask substrate 101 illustrated in FIG. 2, and descriptions thereof are not repeated herein. The translucent layer 105 may be formed on the mask substrate 101 and completely cover the mask substrate 101. The thickness T2, the material, the opacity of the translucent layer 105 may be similar to the translucent layer 105 illustrated in FIG. 4, and descriptions thereof are not repeated herein.

With reference to FIG. 21, the opaque layer 103 may be formed on the translucent layer 105. It should be noted that the opaque layer 103 may be opposite to the mask substrate 101 with the translucent layer 105 interposed therebetween in the present embodiment. The thickness T1, the material, the opacity of the opaque layer 103 may be similar to the opaque layer 103 illustrated in FIG. 2, and descriptions thereof are not repeated herein.

Figure 22:
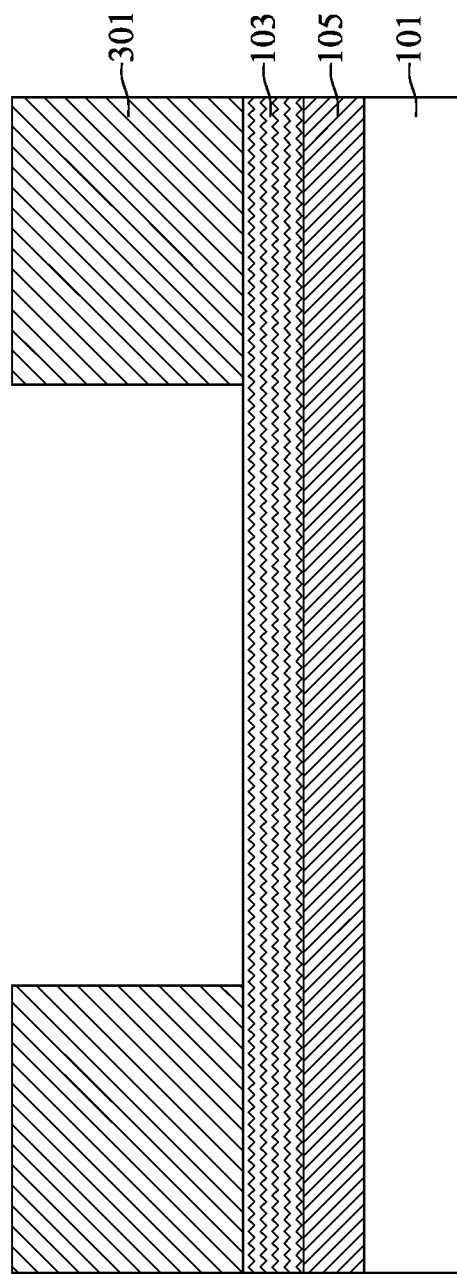
Figure 23:
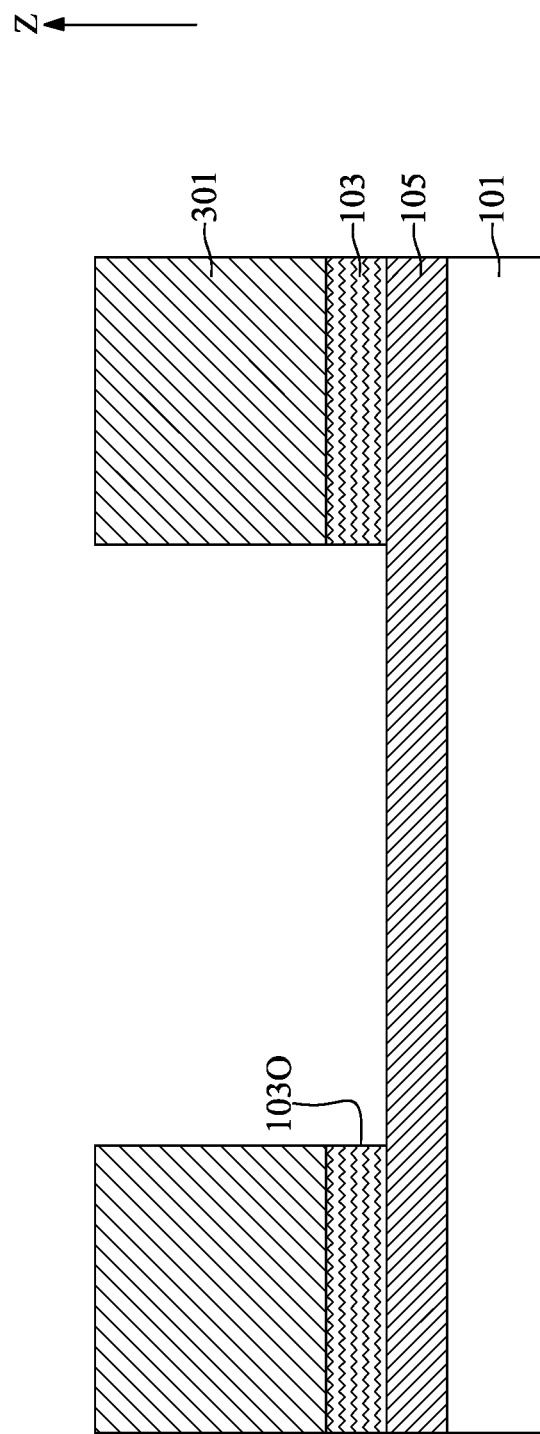

With reference to FIGS. 19, 22, and 23, at step S23, the opaque layer 103 may be pattern-written to form a mask opening 103O of trench feature in the opaque layer 103.

With reference to FIG. 22, a first mask layer 301 may be formed on the opaque layer 103. The first mask layer 301 may have a structure similar to the first mask layer 301 illustrated in FIG. 2, and descriptions thereof are not repeated herein.

With reference to FIG. 23, a trench-etching process using the first mask layer 301 as a mask may be performed to remove a portion of the opaque layer 103. After the trench-etching process, the mask opening 103O of trench feature may be formed in the opaque layer 103. A first portion of the top surface of the translucent layer 105 may be exposed through the mask opening 103O of trench feature. In some embodiments, the etch rate ratio of the opaque layer 103 to the translucent layer 105 may be between about 100:1 and about 1.05:1, between about 15:1 and about 2:1, or between about 10:1 and about 2:1 during the trench-etching process. After the mask opening 103O of trench feature is formed, the first mask layer 301 may be removed.

Figure 24:
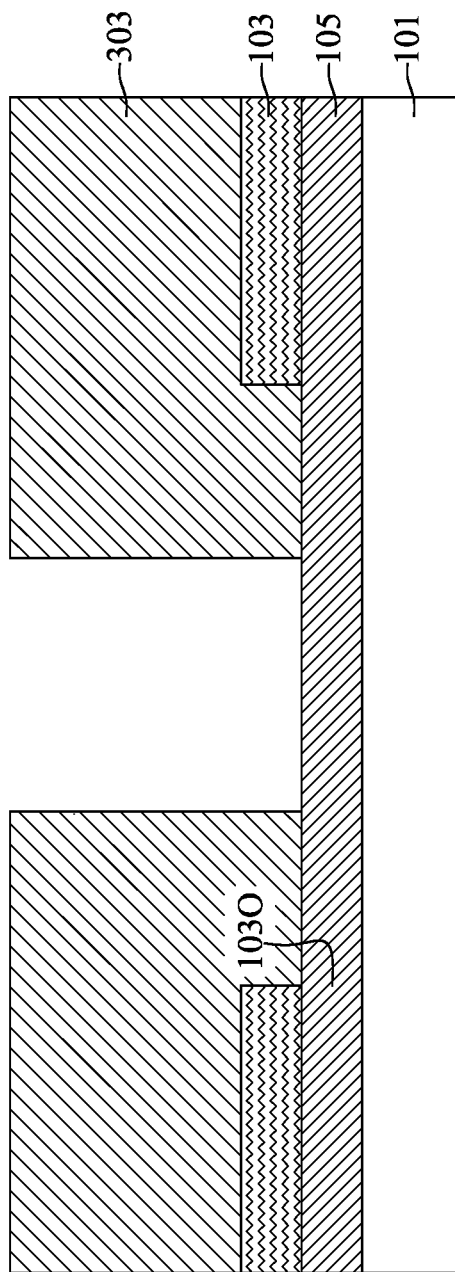
Figure 25:
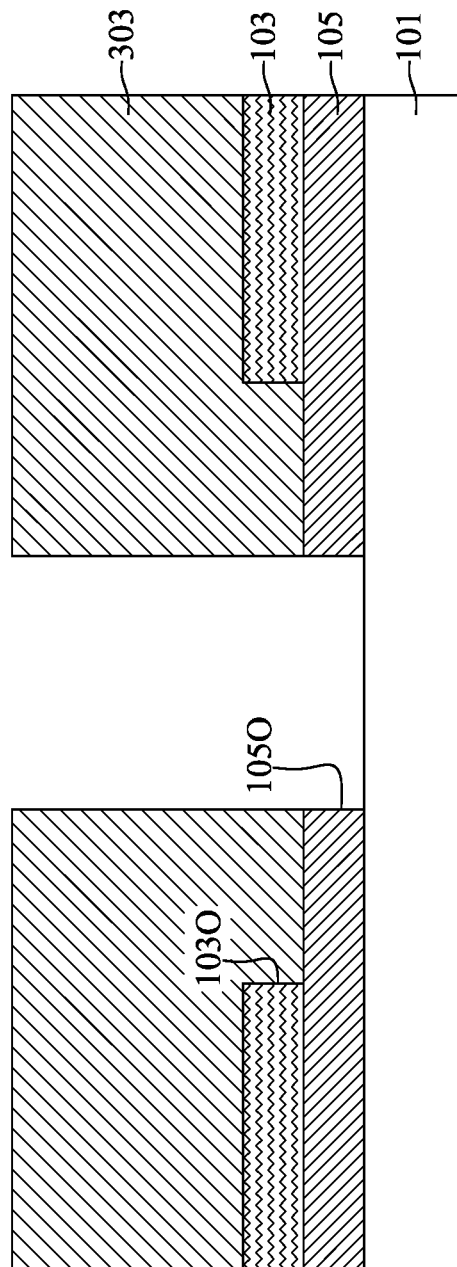

With reference to FIGS. 19, 24, and 25, at step S25, the translucent layer 105 may be pattern-written to form a mask opening 105O of via feature, wherein the mask substrate 101, the opaque layer 103, and the translucent layer 105 together configure the photomask 100D.

With reference to FIG. 24, a second mask layer 303 may be formed on the opaque layer 103 and the translucent layer 105. The second mask layer 303 may have a structure similar to the second mask layer 303 illustrated in FIG. 5, and descriptions thereof are not repeated herein.

With reference to FIG. 25, a via-etching process may be performed with a procedure similar to that illustrated in FIG. 6, and descriptions thereof are not repeated herein.

With reference to FIG. 19 and FIGS. 26 to 28, at step S27, a device stack SKD may be provided, a pre-process mask layer 401 may be formed on the device stack SKD, the pre-process mask layer 401 may be pattern-written using the photomask 100D to form a patterned mask layer 403, and a damascene etching process may be performed to form a via opening 203O and a trench opening 205O of the device stack SKD.

Figure 26:
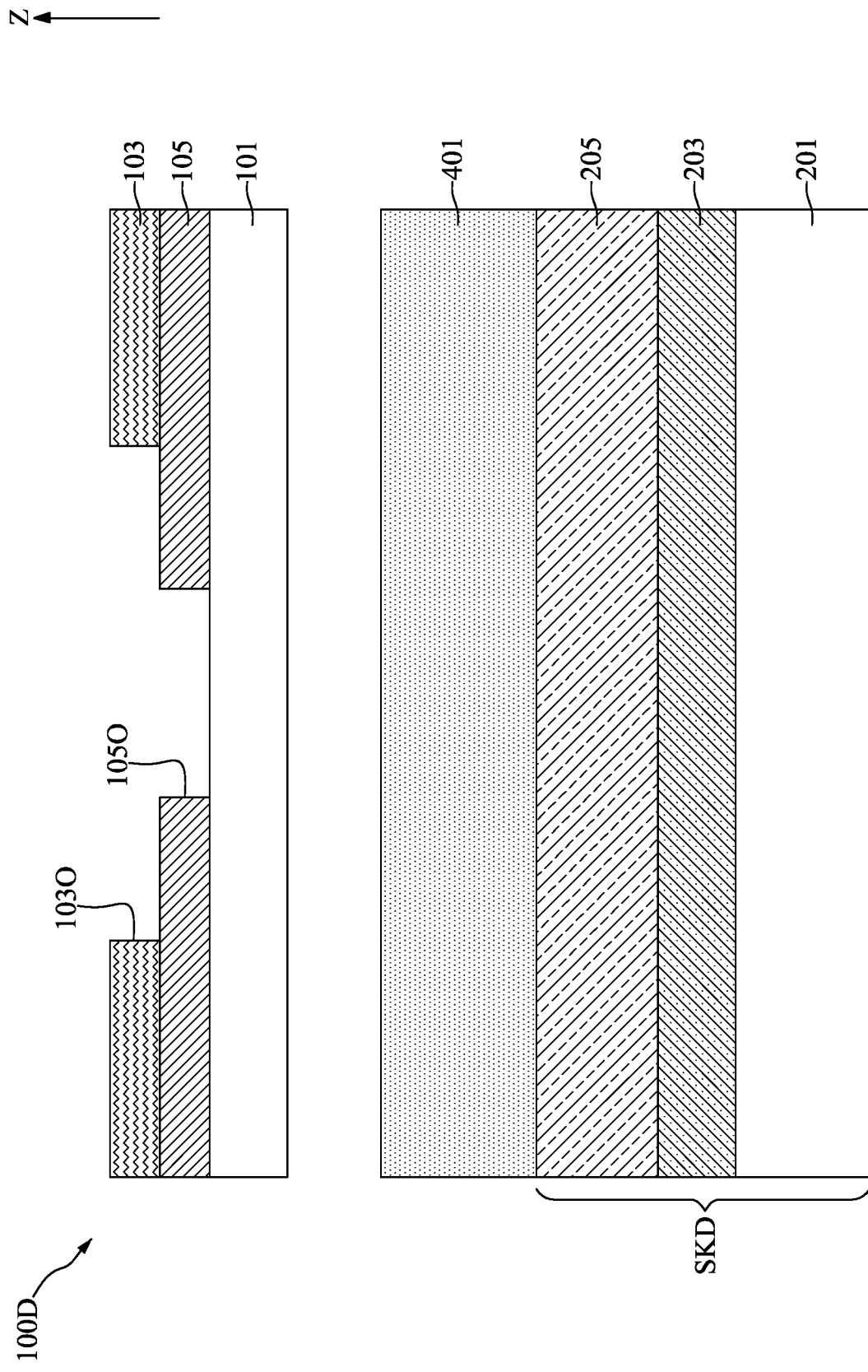

With reference to FIG. 26, the device stack SKD and the pre-process mask layer 401 may have structures similar to that illustrated in FIG. 7. The same or similar elements in FIG. 26 as in FIG. 7 have been marked with similar reference numbers and duplicative descriptions have been omitted.

Figure 27:
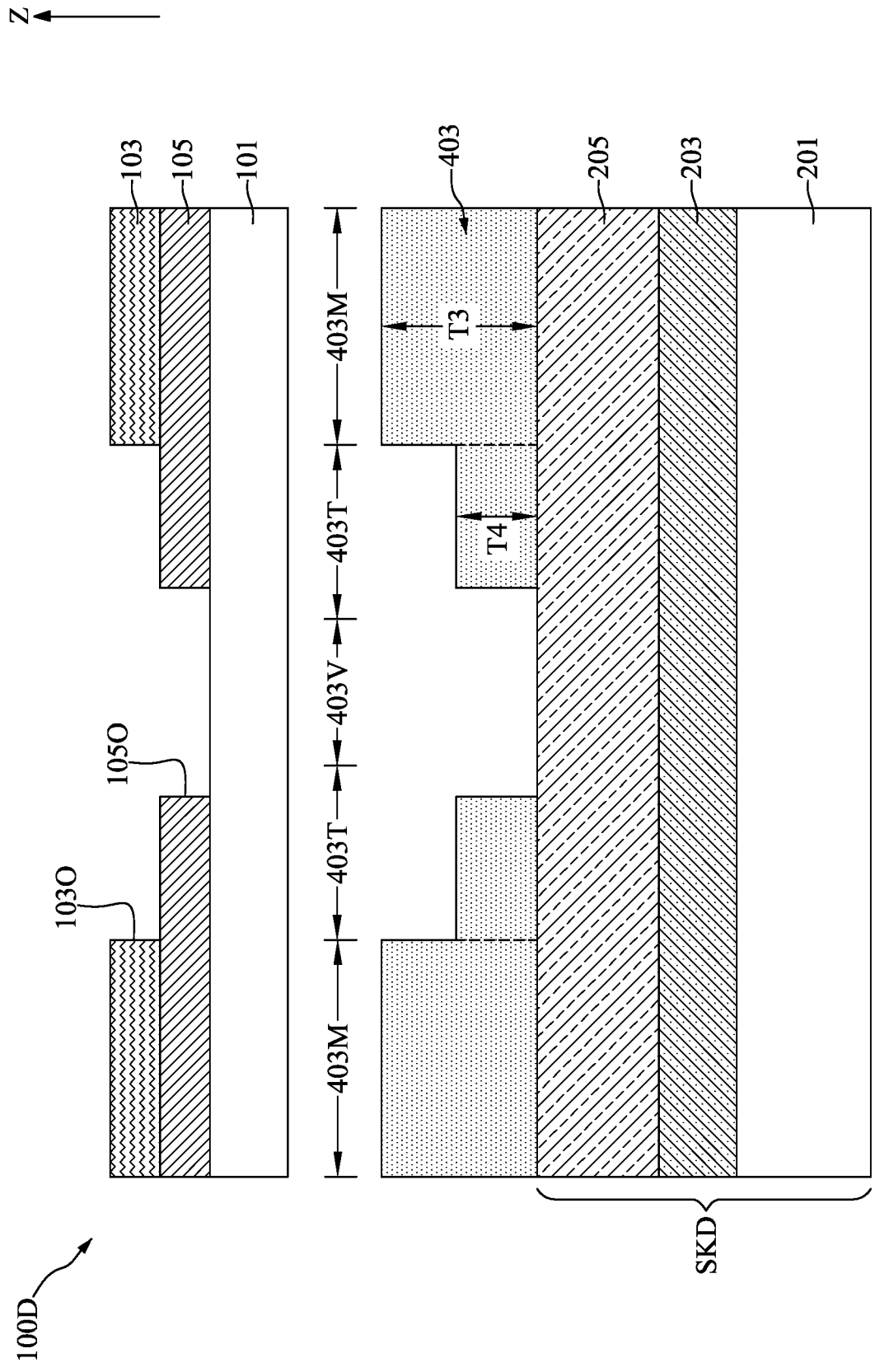

With reference to FIG. 27, the pre-process mask layer 401 may be pattern-written to form the patterned mask layer 403 with a procedure similar to that illustrated in FIG. 8, and descriptions thereof are not repeated herein.

Figure 28:
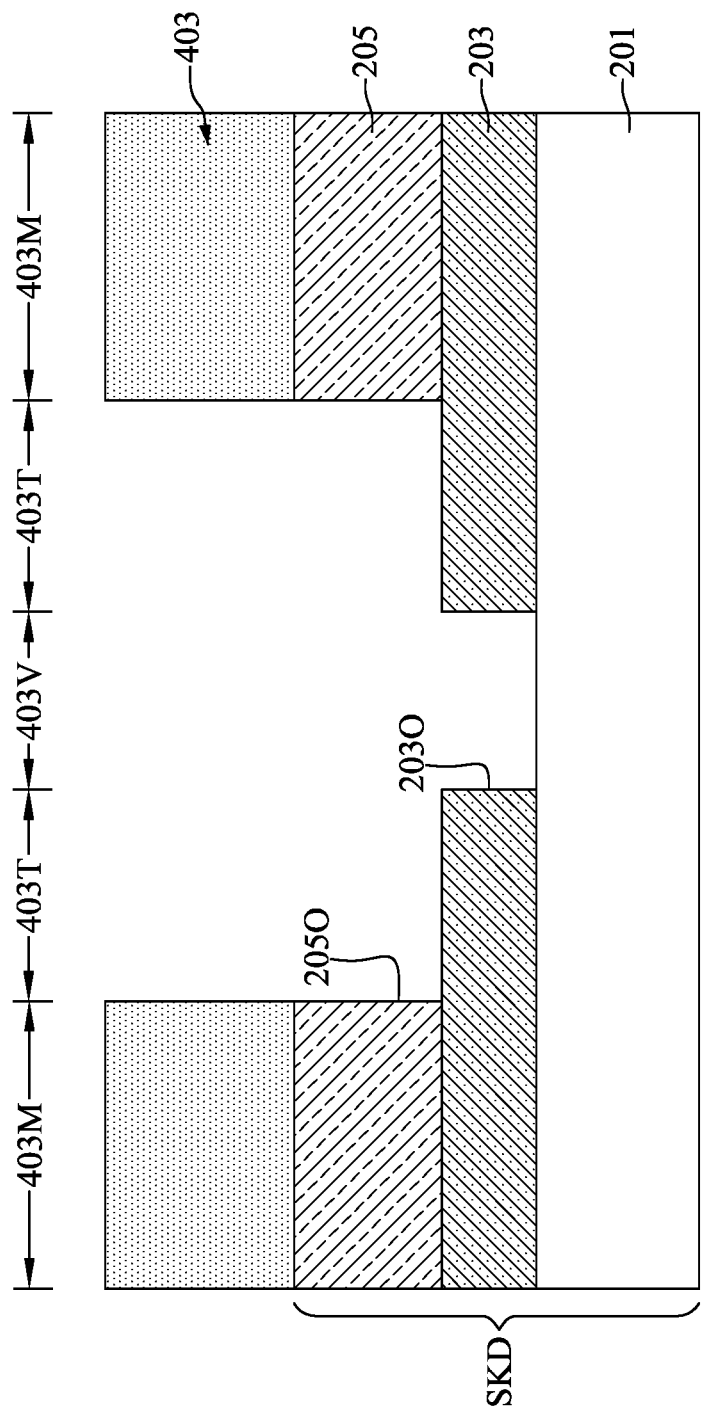

With reference to FIG. 28, the damascene etching process may be performed with a procedure similar to that illustrated in FIG. 9, and descriptions thereof are not repeated herein.

Figure 29:
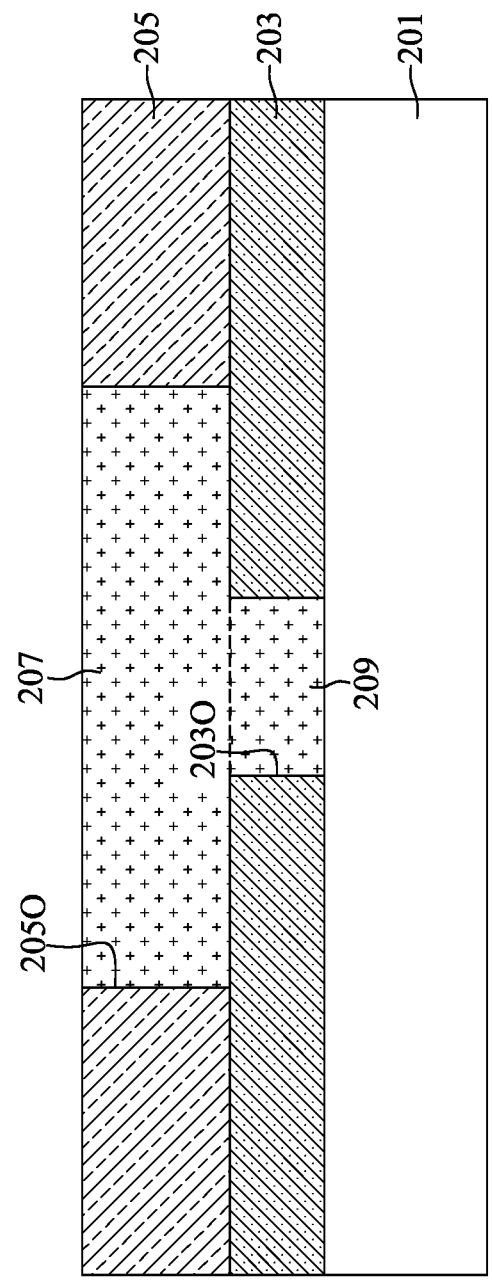

With reference to FIGS. 19 and 29, at step S29, a via 209 may be formed in the via opening 203O and a trench 207 may be formed in the trench opening 205O to configure the semiconductor device 200D.

With reference to FIG. 29, the trench 207 and the via 209 may be formed with a procedure similar to that illustrated in FIG. 10, and descriptions thereof are not repeated herein. The substrate 201, the first dielectric layer 203, the second dielectric layer 205, the trench 207, and the via 209 together configure the semiconductor device 200D.

FIGS. 30 to 34 illustrate, in schematic cross-sectional view diagrams, a flow for fabricating a photomask 100E in accordance with another embodiment of the present disclosure.

Figure 30:
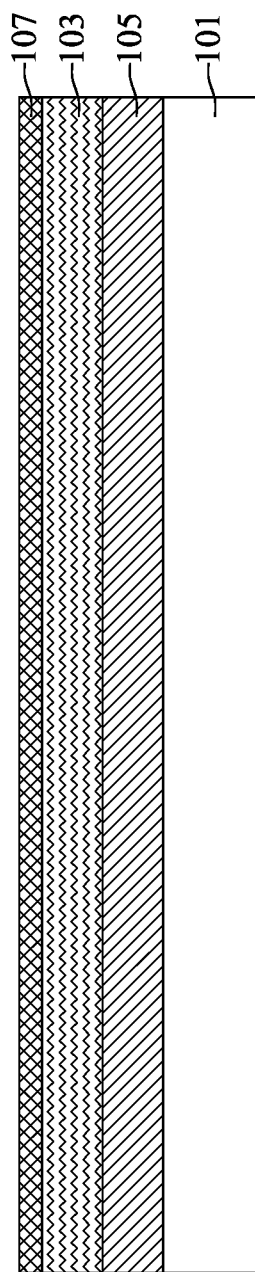
FIGS. 30 to 34 illustrate, in schematic cross-sectional view diagrams, a flow for fabricating a photomask in accordance with another embodiment of the present disclosure.

With reference to FIG. 30, the mask substrate 101, the translucent layer 105, and the opaque layer 103 may have structures similar to that illustrated in FIG. 21. The same or similar elements in FIG. 30 as in FIG. 21 have been marked with similar reference numbers and duplicative descriptions have been omitted.

With reference to FIG. 30, an antireflective layer 107 may be formed on the opaque layer 103. The antireflective layer 107 may include chromium materials containing at least one of oxygen, nitrogen and carbon. Examples for the material of the antireflective layer 107 may be chromium oxide, chromium nitride, chromium oxynitride, chromium oxycarbide, and chromium oxide nitride carbide. In some embodiments, the thickness of the antireflective layer 107 may be one quarter of the wavelength of the source of pattern-writing. In some embodiments, the thickness of the antireflective layer 107 may be between about 10 nm and about 100 nm, or between about 10 nm and about 40 nm. The antireflective layer 107 may improve the precision of pattern-writing.

Figure 31:
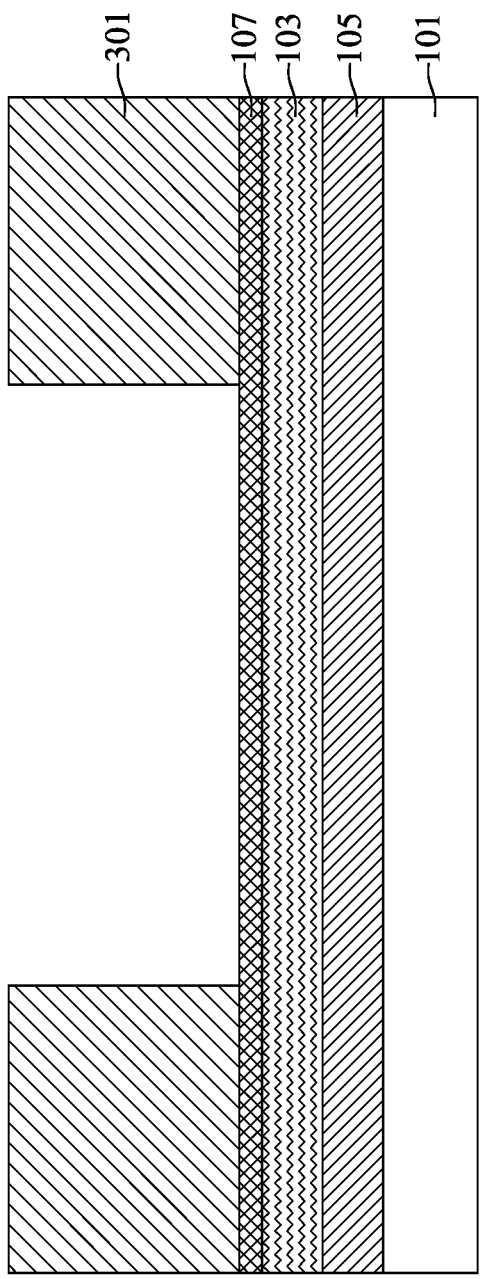

With reference to FIG. 31, a first mask layer 301 may be formed on the antireflective layer 107. The first mask layer 301 may have a structure similar to the first mask layer 301 illustrated in FIG. 22, and descriptions thereof are not repeated herein.

Figure 32:
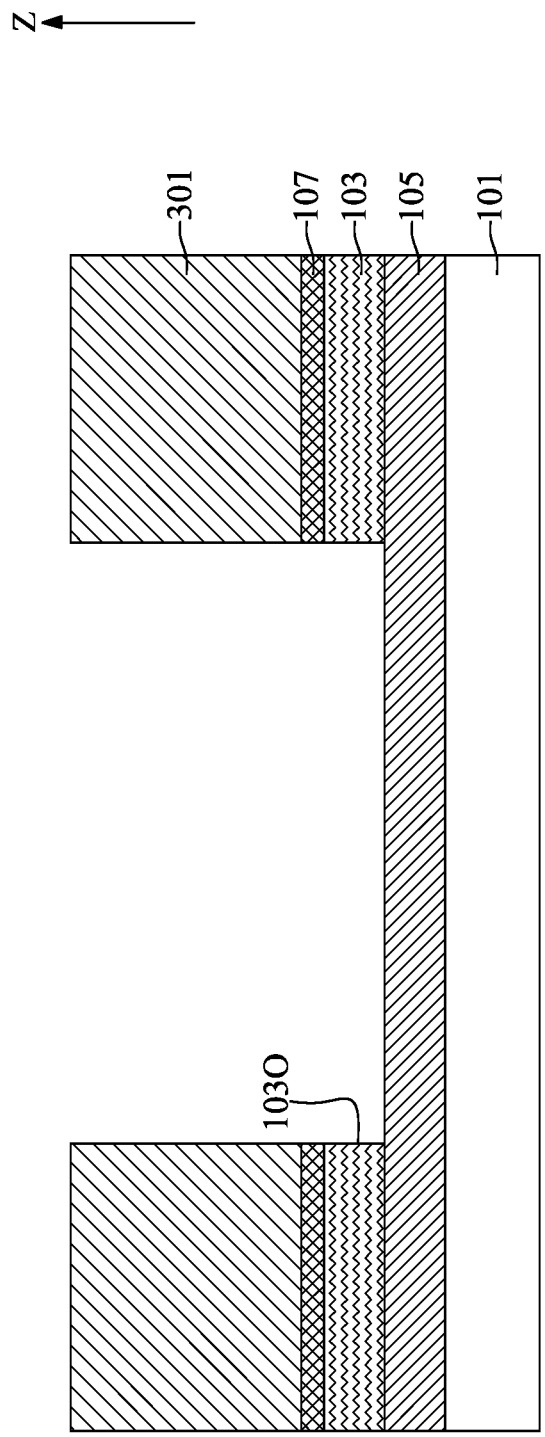

With reference to FIG. 32, a trench-etching process using the first mask layer 301 as a mask may be performed to remove a portion of the opaque layer 103 and a portion of the antireflective layer 107 to form the mask opening 103O of trench feature. A first portion of the top surface of the mask substrate 101 may be exposed through the mask opening 103O of trench feature. In some embodiments, the trench-etching process may include multiple stages for etching the antireflective layer 107 and the opaque layer 103, respectively and correspondingly. In some embodiments, the etch rate ratio of the antireflective layer 107 to the opaque layer 103 opaque layer 103 may be between about 100:1 and about 1.05:1, between about 15:1 and about 2:1, or between about 10:1 and about 2:1 during the trench-etching process. In some embodiments, the etch rate ratio of the opaque layer 103 to the mask substrate 101 may be between about 100:1 and about 1.05:1, between about 15:1 and about 2:1, or between about 10:1 and about 2:1 during the trench-etching process. After the mask opening 103O of trench feature is formed, the first mask layer 301 may be removed.

Figure 33:
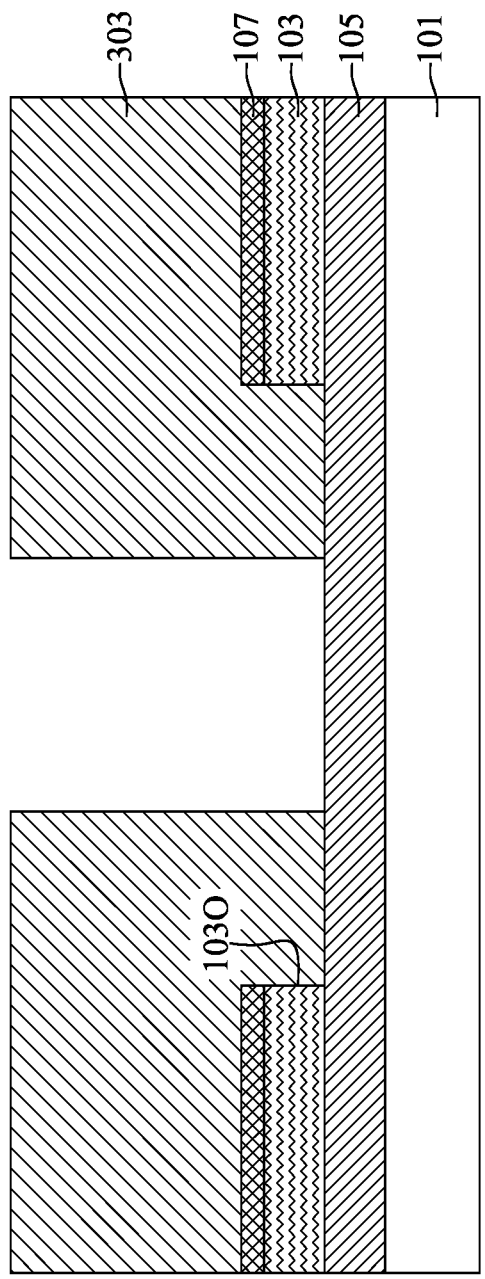

With reference to FIG. 33, a second mask layer 303 may be formed to cover the opaque layer 103, the antireflective layer 107, and a portion of the translucent layer 105 by a photolithography process. The second mask layer 303 may include a pattern of the mask opening 105O of via feature. In some embodiments, the second mask layer 303 may be a photoresist such as commercially available photoresist OCG895i or other suitable photoresists.

Figure 34:
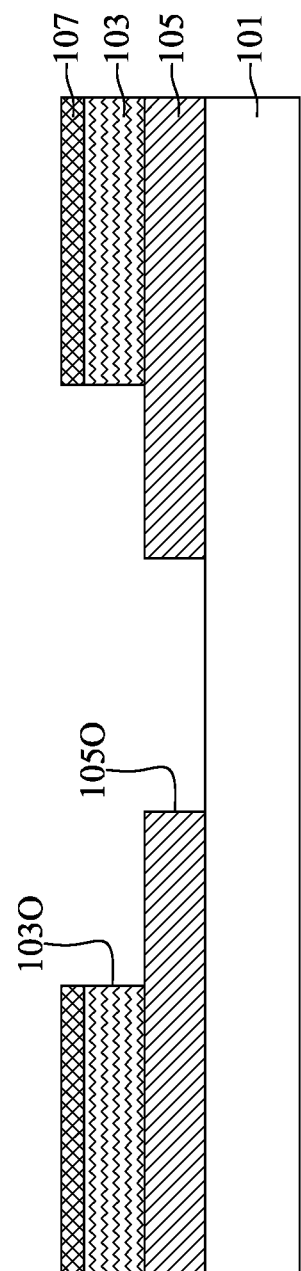

With reference to FIG. 34, a via-etching process using the second mask layer 303 as a mask may be performed to remove the exposed portion of the translucent layer 105. After the via-etching process, the mask opening 105O of via feature may be formed in the translucent layer 105. A second portion of the top surface of the mask substrate 101 may be exposed through the mask opening 105O of via feature. In some embodiments, the etch rate ratio of the translucent layer 105 to the mask substrate 101 may be between about 100:1 and about 1.05:1, between about 15:1 and about 2:1, or between about 10:1 and about 2:1 during the via-etching process. After the mask opening 105O of via feature is formed, the second mask layer 303 may be removed. The mask substrate 101, the opaque layer 103, the translucent layer 105, and the antireflective layer 107 together configure the photomask 100E.

One aspect of the present disclosure provides a method for fabricating a semiconductor device including providing a photomask including an opaque layer on a mask substrate and surrounding a translucent layer on the mask substrate; providing a device stack including a first dielectric layer on a substrate, and a second dielectric layer on the first dielectric layer; forming a pre-process mask layer on the device stack; patterning the pre-process mask layer using the photomask to form a patterned mask layer including a mask region corresponding to the opaque layer, a trench region corresponding to the translucent layer, and a via hole corresponding to the mask opening of via feature; performing a damascene etching process to form a via opening in the first dielectric layer and a trench opening in the second dielectric layer; and forming a via in the via opening and a trench in the trench opening to configure the semiconductor device. The translucent layer includes a mask opening of via feature which exposes a portion of the mask substrate. A thickness of the trench region is less than a thickness of the mask region.

Another aspect of the present disclosure provides a method for fabricating a semiconductor device including providing a photomask including a translucent layer on a mask substrate and including a mask opening of via feature which exposes a portion of the mask substrate, and an opaque layer on the translucent layer and including a mask opening of trench feature which exposes a portion of the translucent layer and the portion of the mask substrate; providing a device stack including a first dielectric layer on a substrate, and a second dielectric layer on the first dielectric layer; forming a pre-process mask layer on the device stack; patterning the pre-process mask layer using the photomask to form a patterned mask layer including a mask region corresponding to the opaque layer, a trench region corresponding to the portion of the translucent layer, and a via hole corresponding to the mask opening of via feature; performing a damascene etching process to form a via opening in the first dielectric layer and a trench opening in the second dielectric layer; and forming a via in the via opening and a trench in the trench opening to configure the semiconductor device. A thickness of the trench region is less than a thickness of the mask region.

Another aspect of the present disclosure provides a method for fabricating a semiconductor device including providing a photomask including an opaque layer on a mask substrate and surrounding a translucent layer on the mask substrate; providing a device stack including a first dielectric layer on a substrate, a first etch stop layer on the first dielectric layer, and a second dielectric layer on the first etch stop layer; forming a pre-process mask layer on the device stack; patterning the pre-process mask layer using the photomask to form a patterned mask layer including a mask region corresponding to the opaque layer, a trench region corresponding to the translucent layer, and a via hole corresponding to the mask opening of via feature; performing a damascene etching process to form a via opening along the first etch stop layer and the first dielectric layer, and a trench opening in the second dielectric layer; and forming a via in the via opening and a trench in the trench opening to configure the semiconductor device. The translucent layer includes a mask opening of via feature which exposes a portion of the mask substrate. A thickness of the trench region is less than a thickness of the mask region.

Another aspect of the present disclosure provides a method for fabricating a photomask including providing a mask substrate; forming an opaque layer on the mask substrate; pattern-writing the opaque layer to form a mask opening of trench feature in the opaque layer and expose the mask substrate; forming a translucent layer in the mask opening of trench feature to cover the mask substrate; and pattern-writing the translucent layer to form a mask opening of via feature to expose a portion of the mask substrate.

Due to the design of the method for fabricating the semiconductor device of the present disclosure, the via opening 203O and the trench opening 205O of the semiconductor device 200A may be formed in a single step damascene etching process by employing the photomask 100A including the translucent layer 105. As a result, the process complexity for fabricating the semiconductor device 200A may be reduced. In addition, by employing the first etch stop layer 211, the undesired removal of the first dielectric layer 203 may be alleviated or avoided. In other words, the loading effect may be alleviated or avoided during the damascene etching process. As a result, the reliability and quality of the result semiconductor device 200B may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a photomask comprising an opaque layer on a mask substrate and surrounding a translucent layer on the mask substrate, wherein the translucent layer comprises a mask opening of via feature which exposes a portion of the mask substrate, wherein a top surface of the opaque layer is coplanar with a top surface of the translucent layer;
   providing a device stack comprising a first dielectric layer on a substrate, a first etch stop layer on the first dielectric layer, and a second dielectric layer on the first etch stop layer;
   forming a pre-process mask layer on the device stack;
   patterning the pre-process mask layer using the photomask to form a patterned mask layer comprising a mask region corresponding to the opaque layer, a trench region corresponding to the translucent layer, and a via hole corresponding to the mask opening of via feature, wherein a thickness of the trench region is less than a thickness of the mask region;

performing a damascene etching process to form a via opening in the first dielectric layer and a trench opening in the second dielectric layer, wherein the trench opening has a bottom on the first etch stop layer; and forming a via in the via opening and a trench in the trench opening.

2. The method for fabricating the semiconductor device of claim 1, wherein a thickness ratio of the thickness of the trench region to the thickness of the mask region is between about 25% and about 85%.

3. The method for fabricating the semiconductor device of claim 2, wherein the thickness ratio of the thickness of the trench region to the thickness of the mask region is between about 45% and about 65%.

4. The method for fabricating the semiconductor device of claim 3, wherein providing the photomask comprising:
   providing the mask substrate;
   forming the opaque layer on the mask substrate;
   pattern-writing the opaque layer to form a mask opening of trench feature in the opaque layer and expose the mask substrate;
   forming the translucent layer in the mask opening of trench feature to cover the mask substrate; and
   pattern-writing the translucent layer to form the mask opening of via feature to expose the portion of the mask substrate.

5. The method for fabricating the semiconductor device of claim 4, wherein a thickness of the opaque layer and a thickness of the translucent layer are substantially the same, wherein a thickness of the second dielectric layer is greater than a thickness of the first dielectric layer.

6. The method for fabricating the semiconductor device of claim 5, wherein the opaque layer comprises chrome.

7. The method for fabricating the semiconductor device of claim 6, wherein the translucent layer comprises molybdenum silicide or silicon nitride.

8. The method for fabricating the semiconductor device of claim 7, wherein an etch rate to the first dielectric layer and an etch rate to the second dielectric layer during the damascene etching process is substantially the same.

9. The method for fabricating the semiconductor device of claim 7, wherein the first etch stop layer comprises silicon nitride, silicon carbonitride, or silicon oxycarbide.

10. The method for fabricating the semiconductor device of claim 9, further comprising: forming a second etch stop layer formed between the substrate and the first dielectric layer at a position that a bottom side of the second etch stop layer is in contact with the substrate while a top side of the second etch stop layer is in contact with the first dielectric layer;
    wherein the second etch stop layer comprises silicon nitride, silicon carbonitride, or silicon oxycarbide;
    wherein during the damascene etching process, the via opening is formed along the first etch stop layer, the first dielectric layer, and the second etch stop layer.

11. The method for fabricating the semiconductor device of claim 4, wherein the damascene etching process is performed in different stages,
    wherein during a first stage of the damascene etching process, the etch rate of the second dielectric layer is higher than an etch rate of the first etch stop layer;
    wherein during a second stage of the damascene etching process, the etch rate of the first etch stop layer is higher than an etch rate of the first dielectric layer;
    wherein during the first stage and the second stage of the damascene etching process, the trench region of the patterned mask layer is presented to protect the second dielectric layer corresponding to the trench region;
    wherein during a third stage of the damascene etching process, the etch rate of the second dielectric layer is higher than the etch rate of the first etch stop layer;
    wherein in the third stage of the damascene etching process, the trench region of the patterned mask layer is completely consumed and the second dielectric layer corresponding to the trench region is removed.

12. The method for fabricating the semiconductor device of claim 1, wherein an opacity ratio of an opacity of the translucent layer to an opacity of the opaque layer is between about 5% and about 95%.

13. The method for fabricating the semiconductor device of claim 1, wherein an opacity ratio of an opacity of the translucent layer to an opacity of the opaque layer is between about 45% and about 75%, wherein the via and the trench are made of conductive material selected from a group consisting of tungsten, cobalt, zirconium, tantalum, titanium, aluminum, ruthenium, tantalum carbide, titanium carbide, tantalum magnesium carbide, titanium nitride, and transition metal aluminides.

* * * * *